(12) United States Patent
Madurawe

(10) Patent No.: US 7,129,744 B2
(45) Date of Patent: Oct. 31, 2006

(54) PROGRAMMABLE INTERCONNECT STRUCTURES

(75) Inventor: Raminda U. Madurawe, Sunnyvale, CA (US)

(73) Assignee: Viciciv Technology, Sunnyvale, CA (US)

( * ) Notice: Subject to any disclaimer, the term of this patent is extended or adjusted under 35 U.S.C. 154(b) by 368 days.

(21) Appl. No.: 10/691,013

(22) Filed: Oct. 23, 2003

(65) Prior Publication Data

US 2005/0091630 A1 Apr. 28, 2005

Related U.S. Application Data

(60) Provisional application No. 60/419,759, filed on Oct. 21, 2002.

(51) Int. Cl.
*H03K 19/173* (2006.01)

(52) U.S. Cl. .......................... 326/38; 326/83

(58) Field of Classification Search ............ 326/38–41, 326/82, 83, 86
See application file for complete search history.

(56) References Cited

U.S. PATENT DOCUMENTS

| | | |
|---|---|---|
| 4,609,986 A | 9/1986 | Hartmann et al. |
| 4,706,216 A | 11/1987 | Carter |
| 4,761,768 A | 8/1988 | Turner et al. |
| 4,870,302 A | 9/1989 | Freeman |
| 4,873,459 A | 10/1989 | El Gamal et al. |
| 5,343,406 A | 8/1994 | Freeman et al. |
| 5,488,316 A | 1/1996 | Freeman et al. |
| 5,835,405 A | 11/1998 | Tsui et al. |
| 5,844,422 A | 12/1998 | Trimberger et al. |

(Continued)

OTHER PUBLICATIONS

Seals & Whapshott, "Programmable Logic—PLDs and FPGAs", 1997, pp. 102-117, McGraw-Hill, USA, no month.

(Continued)

*Primary Examiner*—Don Le

(57) ABSTRACT

A programmable interconnect structure for an integrated circuit comprises: a pass-gate fabricated on a substrate layer to electrically connect a first node to a second node; and a configuration circuit including at least one memory element to control said pass-gate fabricated substantially above said substrate layer; and a programmable method to select between isolating said first and second nodes and connecting said first and second nodes.

A programmable buffer structure for an integrated circuit comprises: a first and a second terminal; and a programmable pull-up and a programmable pull-down circuit coupled between said first and second terminals; and a configuration circuit including at least one memory element coupled to said pull-up and pull-down circuits; and a programmable method to select between isolating said first terminal from second terminal by deactivating said pull-up and pull-down circuits, and coupling said first terminal to second terminal by activating said pull-up and pull-down circuits.

A method of forming a programmable interconnect structure for an integrated circuit comprises: fabricating one or more pass-gates on a substrate layer to electrically connect two points; and selectively fabricating either a memory circuit or a conductive pattern substantially above said pass-gates to control a portion of said pass-gates; and fabricating an interconnect and routing layer substantially above said memory circuits to connect said pass-gates and one of said memory circuits and conductive pattern.

37 Claims, 13 Drawing Sheets
(2 of 13 Drawing Sheet(s) Filed in Color)

U.S. PATENT DOCUMENTS

| | | | |
|---|---|---|---|
| 5,861,761 A * | 1/1999 | Kean | 326/41 |
| 6,134,173 A | 10/2000 | Cliff et al. | |
| 6,239,613 B1 | 5/2001 | Reddy et al. | |
| 6,262,595 B1 * | 7/2001 | Huang et al. | 326/41 |
| 6,275,065 B1 | 8/2001 | Mendel | |
| 6,448,808 B1 | 9/2002 | Young et al. | |
| 6,515,511 B1 | 2/2003 | Sugibayashi et al. | |
| 6,831,481 B1 * | 12/2004 | Nguyen et al. | 326/58 |
| 2004/0225980 A1 * | 11/2004 | Cappelli et al. | 716/8 |

OTHER PUBLICATIONS

Ashok K. Sharma, "Programmable Logic Handbook—PLDs, CPLDs, & FPGAs", 1998, pp. 99-171, McGraw-Hill, USA, no month.

V. Betz, J. Rose, A. Marquardt, "Architecture and CAD for Deep-Submicron FPGAs", Feb. 1999, Kluwer Academic Publishers, Boston.

* cited by examiner

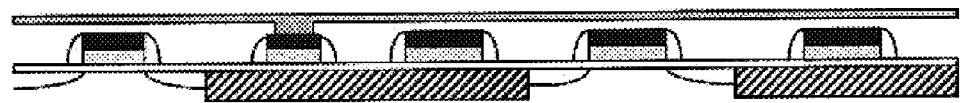
Fig - 12.1
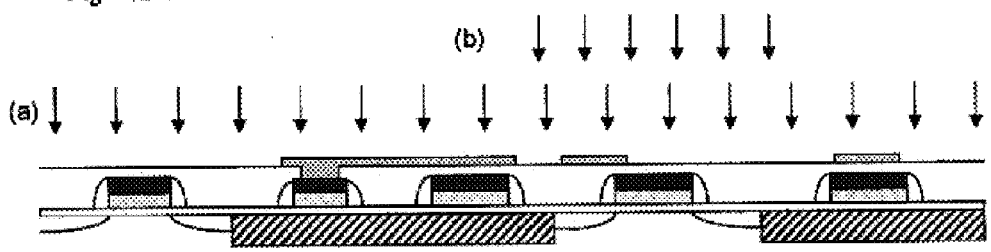
Fig - 12.2
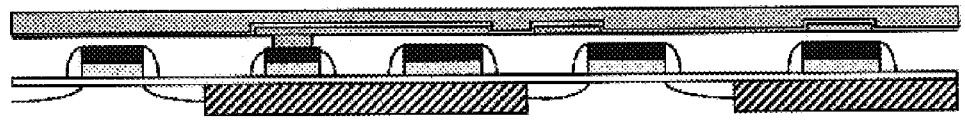
Fig - 12.3
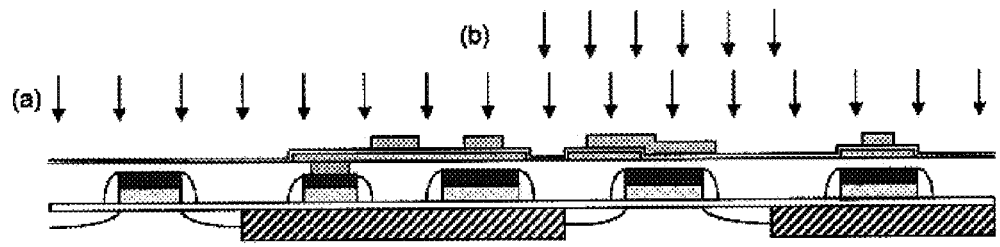
Fig - 12.4

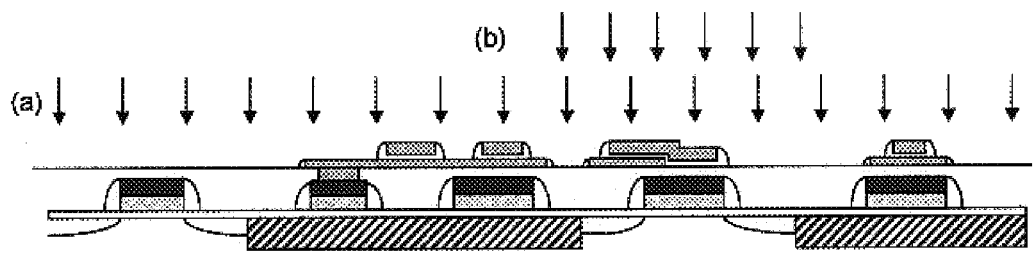
Fig - 12.5
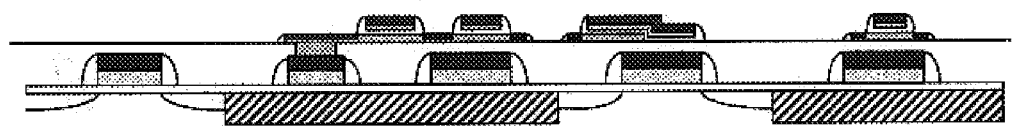
Fig - 12.6
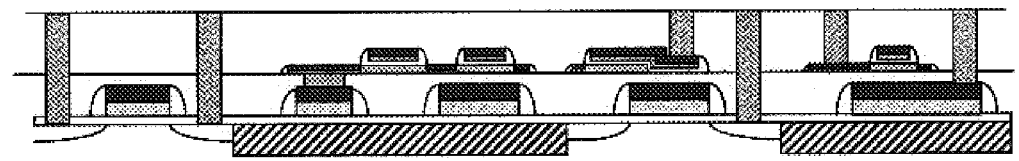
Fig - 12.7

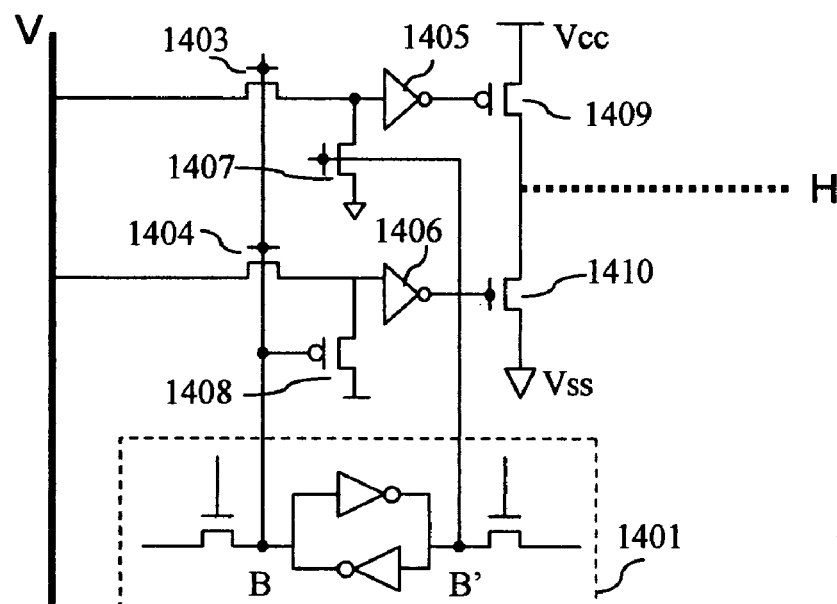
Fig-14A
Fig-14B
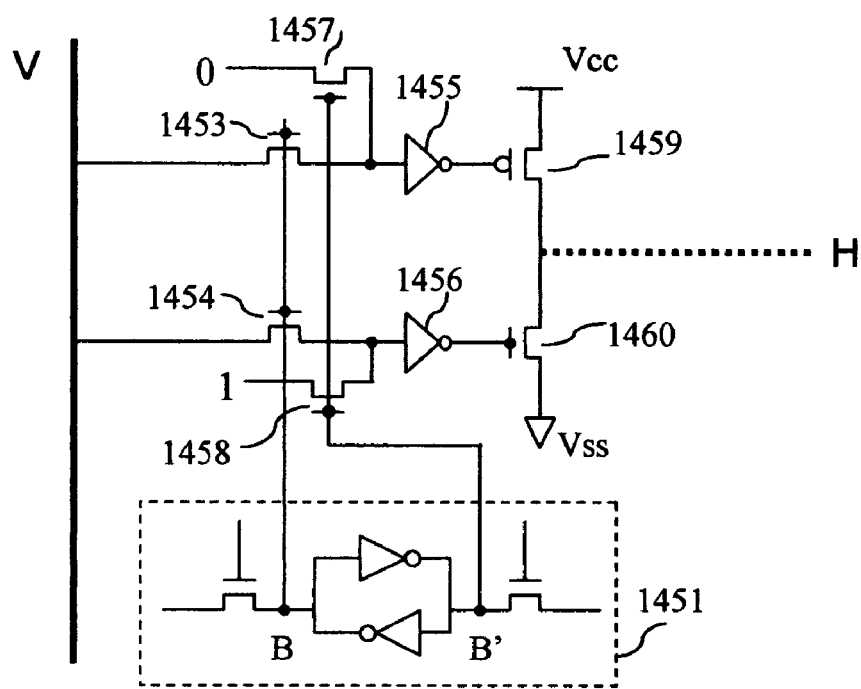
Fig-14C

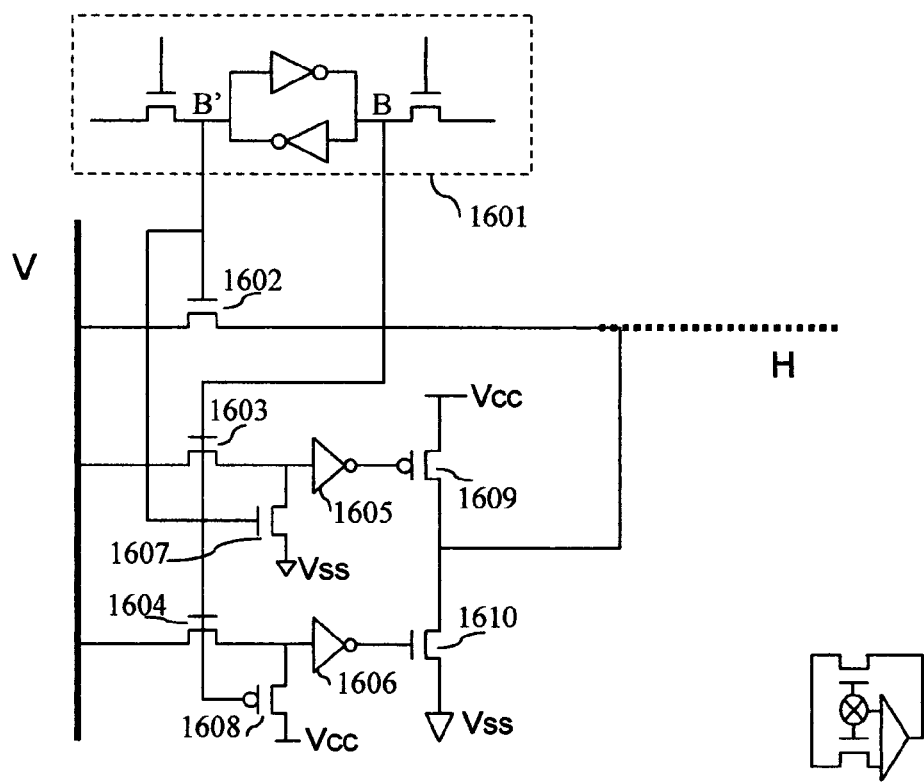
Fig-16A
Fig-16B
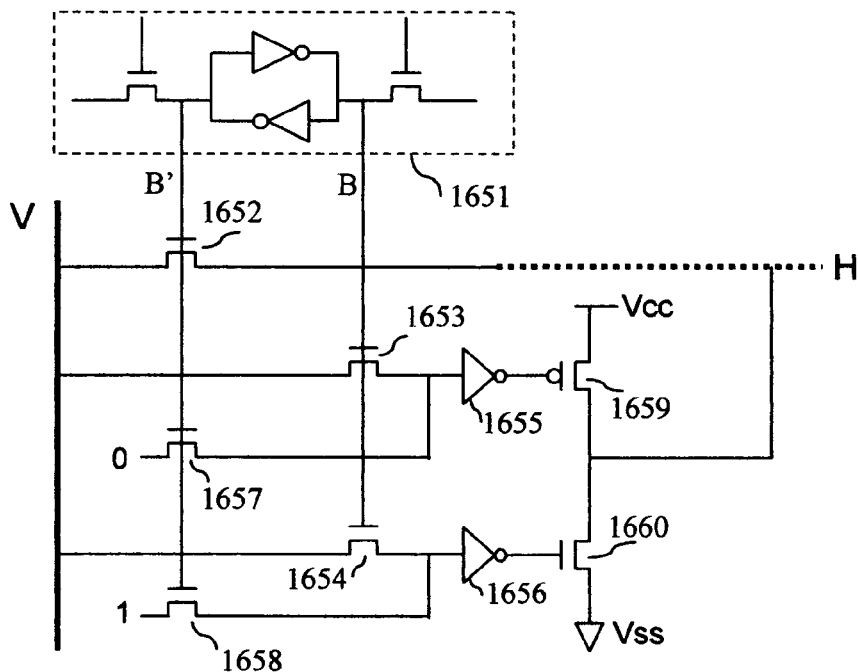
Fig-16C

PROGRAMMABLE INTERCONNECT STRUCTURES

This application claims priority from Provisional Application Ser. No. 60/419,759 entitled "Re-programmable interconnect structures" filed on Oct. 21, 2002 which has as inventor Mr. R. U. Madurawe and the contents of which are incorporated herein by reference.

BACKGROUND

The present invention relates to programmable interconnect structures.

Traditionally, integrated circuit (IC) devices such as custom, semi-custom, or application specific integrated circuit (ASIC) devices have been used in electronic products to reduce cost, enhance performance or meet space constraints. However, the design and fabrication of custom or semi-custom ICs can be time consuming and expensive. The customization involves a lengthy design cycle during the product definition phase and high Non Recurring Engineering (NRE) costs during manufacturing phase. In the event of finding a logic error in the custom or semi-custom IC during final test phase, the design and fabrication cycle has to be repeated. Such lengthy correction cycles further aggravate the time to market and engineering cost. As a result, ASICs serve only specific applications and are custom built for high volume and low cost.

Another type of semi custom device called a Gate Array customizes modular blocks at a reduced NRE cost by synthesizing the design using a software model similar to the ASIC. The missing silicon level design verification results in multiple spins and lengthy design iterations. Structured ASICs come under larger module Gate Arrays.

In recent years there has been a move away from custom or semi-custom ICs toward field programmable components whose function is determined not when the integrated circuit is fabricated, but by an end user "in the field" prior to use. Off the shelf, generic Programmable Logic Device (PLD) or Field Programmable Gate Array (FPGA) products greatly simplify the design cycle. These products offer user-friendly software to fit custom logic into the device through programmability, and the capability to tweak and optimize designs to improve silicon performance. The flexibility of this programmability is expensive in terms of silicon real estate, but reduces design cycle and upfront NRE cost to the designer.

FPGAs offer the advantages of low non-recurring engineering costs, fast turnaround (designs can be placed and routed on an FPGA in typically a few minutes), and low risk since designs can be easily amended late in the product design cycle. It is only for high volume production runs that there is a cost benefit in using the more traditional approaches. Compared to PLD and FPGA, an ASIC has hard-wired logic connections, identified during the chip design phase. ASIC has no multiple logic choices and no configuration memory to customize logic. This is a large chip area and cost saving for the ASIC. Smaller ASIC die sizes lead to better performance. A full custom ASIC also has customized logic functions which take less gate counts compared to PLD and FPGA configurations of the same functions. Thus, an ASIC is significantly smaller, faster, cheaper and more reliable than an equivalent gate-count PLD or FPGA. The trade-off is between time-to-market (PLD and FPGA advantage) versus low cost and better reliability (ASIC advantage). The cost of Silicon real estate for programmability provided by the PLD and FPGA compared to ASIC determines the extra cost the user has to bear for customer re-configurability of logic functions.

In a PLD and an FPGA, a complex logic design is broken down to smaller logic blocks and programmed into logic blocks provided in the FPGA. Smaller logic elements allow sequential and combinational logic design implementations. Combinational logic has no memory and outputs reflect a function solely of present inputs. Sequential logic is implemented by inserting memory into the logic path to store past history. Current PLD and FPGA architectures include transistor pairs, NAND or OR gates, multiplexers, look-up-tables (LUTs) and AND-OR structures in a basic logic element. In a PLD the basic logic element is labeled as macro-cell. Hereafter the terminology FPGA will include both FPGAs and PLDs, and the terminology logic element will include both logic elements and macro-cells. Granularity of a FPGA refers to logic content of a basic logic element. Smaller blocks of a complex logic design are customized to fit into FPGA grain. In fine-grain architectures, a small basic logic element is enclosed in a routing matrix and replicated. These offer easy logic fitting at the expense of complex routing. In course-grain architectures, many basic logic elements are combined with local routing and wrapped in a routing matrix to form a logic block. The logic block is then replicated with global routing. Larger logic blocks make the logic fitting difficult and the routing easier. A challenge for FPGA architectures is to provide easy logic fitting (like fine-grain) and maintain easy routing (like course-grain).

Inputs and outputs for the Logic Element or Logic Block are selected from the programmable Routing Matrix. An exemplary routing matrix containing logic elements described in Ref-1 (Seals & Whapshott) is shown in FIG. 1. In that example, the inputs and outputs from Logic Element are routed to 22 horizontal and 12 vertical interconnect wires with programmable via connections. These connections may be anti-fuses or pass-gate transistors controlled by SRAM memory elements. The logic element having a built in D-flip-flop used with FIG. 1 routing as described in Ref-1 is shown in FIG. 2. In that, elements 201, 202 and 203 are 2:1 MUX's controlled by one input signal each. Element 204 is an OR gate while 205 is a D-Flip-Flop. Without global Preset & Clear signals, eight inputs feed the logic block, and one output leaves the logic block. These 9 wires are shown in FIG. 1 with programmable connectivity. All two-input, most 2-input and some 3-input variable functions are realized in the logic block and latched to the D-Flip Flop. FPGA architectures for various commercially available devices are discussed in Ref-1 (Seals & Whapshott) as well as Ref-2 (Sharma). A comprehensive thesis on FPGA routing architecture is provides in Ref-3 (Betz, Rose & Marquardt).

Routing block wire structure defines how logic blocks are connected to each other. Neighboring logic elements have short wire connections, while die opposite corner logic blocks have long wire connections. All wires are driven by a fixed pre-designed logic element output buffer and the drive does not change on account of wire length. The wire delays become unpredictable as the wire lengths are randomly chosen during the Logic Optimization to best fit the design into a given FPGA. FPGA's also incur lengthy run times during timing driven optimization of partitioned logic. As FPGA's grow bigger in die size, the wire lengths increase and wire delays dominate chip performance. Wire delays grow proportional to square of the wire length, and inverse distance to neighboring wires. Chip sizes remain constant at mask dimension of about 2 cm per side, while metal wire spacing is reduced with technology scaling. A good timing optimization requires in depth knowledge of the specific FPGA fitter, the length of wires segments, and relevant process parameters; a skill not found within the design house doing the fitting. In segmented wire architectures, fixed buffers are provided to drive global signals on selected lines. These buffers are too few, too expensive, and only offer unidirectional data flow. Predictable timing is another challenge for FPGA's. This would enhance place and route tool capability in FPGA's to better fit and optimize timing critical logic designs.

FPGA architectures are discussed in Hartmann U.S. Pat. No. 4,609,986, Carter U.S. Pat. No. 4,706,216, Turner et al. U.S. Pat. No. 4,761,768, Freemann U.S. Pat. No. 4,870,302, ElGamal et al. U.S. Pat. No. 4,873,459, Freemann et al. U.S. Pat. Nos. 5,488,316 & 5,343,406, Tsui et al. U.S. Pat. No. 5,835,405, Trimberger et al. U.S. Pat. No. 5,844,422, Cliff et al. U.S. Pat. No. 6,134,173, Reddy et al. U.S. Pat. No. 6,239,613, Mendel U.S. Pat. No. 6,275,065, Young et al. U.S. Pat. No. 6,448,808, and Sugibayashi et al. U.S. Pat. No. 6,515,511. These patents disclose specialized routing blocks to connect logic elements in FPGA's and macro-cells in PLD's. In all cases the routing block is programmed to define inputs and outputs for the logic blocks, while the logic block performs a specific logic function.

Four methods of programmable point to point connections, synonymous with programmable switches, between A and B are shown in FIG. 3. A circuit to program the connection is not shown. All the patents listed above use one or more of these basic connections. In FIG. 3A, a conductive fuse link 310 connects A to B. It is normally connected, and passage of a high current or a laser beam will blow the conductor open. In FIG. 3B, a capacitive anti-fuse element 320 disconnects A to B. It is normally open, and passage of a high current will pop the insulator shorting the two terminals. Fuse and anti-fuse are both one time programmable due to the non-reversible nature of the change. In FIG. 3C, a pass-gate device 330 connects A to B. The gate signal $S_0$ determines the nature of the connection, on or off. This is a non destructive change. The gate signal is generated by manipulating logic signals, or by configuration circuits that include memory. The choice of memory varies from user to user. In FIG. 3D, a floating-pass-gate device 340 connects A to B. Control gate signal $S_0$ couples a portion of that to floating gate. Electrons trapped in the floating gate determines on or off state of the connection. Hot-electrons and Fowler-Nordheim tunneling are two mechanisms for injecting charge to floating-gates. When high quality insulators encapsulate the floating gate, trapped charge stays for over 10 years. These provide non-volatile memory. EPROM, EEPROM and Flash memory employ floating-gates and are non-volatile. Anti-fuse and SRAM based architectures are widely used in commercial FPGA's, while EPROM, EEPROM, anti-fuse and fuse links are widely used in commercial PLD's. Volatile SRAM memory needs no high programming voltages, is freely available in every logic process, is compatible with standard CMOS SRAM memory, lends to process and voltage scaling and has become the de-facto choice for modern very large FPGA devices.

A volatile six transistor SRAM based configuration circuit is shown in FIG. 4A. The SRAM memory element can be any one of 6-transistor, 5-transistor, full CMOS, R-load or TFT PMOS load based cells to name a few. Two inverters 403 and 404 connected back to back forms the memory element. This memory element is a latch. The latch can be full CMOS, R-load, PMOS load or any other. Power and ground terminals for the inverters are not shown in FIG. 4A. Access NMOS transistors 401 and 402, and access wires GA, GB, BL and BS provide the means to configure the memory element. Applying zero and one on BL and BS respectively, and raising GA and GB high enables writing zero into device 401 and one into device 402. The output $S_0$ delivers a logic one. Applying one and zero on BL and BS respectively, and raising GA and GB high enables writing one into device 401 and zero into device 402. The output $S_0$ delivers a logic zero. The SRAM construction may allow applying only a zero signal at BL or BS to write data into the latch. The SRAM cell may have only one access transistor 401 or 402. The SRAM latch will hold the data state as long as power is on. When the power is turned off, the SRAM bit needs to be restored to its previous state from an outside permanent memory. In the literature for programmable logic, this second non-volatile memory is also called configuration memory. The SRAM configuration circuit in FIG. 4A controlling logic pass-gate as shown in FIG. 3C is illustrated in FIG. 4B. Element 450 represents the configuration circuit. The So output directly driven by the memory element in FIG. 4A drives the pass-gate electrode. In addition to $S_0$ output and the latch, power, ground, data in and write enable signals in 450 constitutes the SRAM configuration circuit. Write enable circuitry includes GA, GB, BL, BS signals shown in FIG. 4A.

A programmable MUX utilizes a plurality of point to point switches. FIG. 5 shows three different MUX based programmable logic constructions. FIG. 5A shows a programmable 2:1 MUX. In the MUX, two pass-gates 511 and 512 allow two inputs $I_0$ and $I_1$ to be connected to output O. A configuration circuit 550 having two complementary output control signals $S_0$ and $S_0'$ provides the programmability. When $S_0=1$, $S_0'=0$; $I_0$ is coupled to O. When $S_0=0$, $S_0'=1$; $I_1$ is coupled to O. With one memory element inside 550, one input is always coupled to the output. If two bits were provided inside 550, two mutually exclusive outputs $S_0$ and $S_1$ could be generated. That would allow neither $I_0$ nor $I_1$ to be coupled to O, if such a requirement exists in the logic design. FIG. 5B shows a programmable 4:1 MUX controlled by 2 memory elements. A similar construction when the 4 inputs $I_0$ to $I_3$ are replaced by 4 memory element outputs $S_0$ to $S_3$, and the pass-gates are controlled by two inputs $I_0$ & $I_1$ is called a 4-input look up table (LUT). The 4:1 MUX in FIG. 5B operate with two memory elements 561 and 562 contained in the configuration circuit 560 (not shown). Similar to FIG. 5A, one of $I_0$, $I_1$, $I_2$ or $I_3$ is connected to O depending on the $S_0$ and $S_1$ states. For example, when $S_0=1$, $S_1=1$, $I_0$ is coupled to O. Similarly, when $S_0=0$ and $S_1=0$, $I_3$ is coupled to O. A 3 bit programmable 3:1 MUX is shown in FIG. 5C. Point D can be connected to A, B or C via pass-gates 531, 533 or 532 respectively. Memory elements 571, 573 and 572 contained in a configuration circuit 570 (not shown) control these pass-gate input signals. Three memory elements are required to connect D to just one, any two or all three points.

FPGA and ASICs require buffers to improve signal propagation delay in long wires. This is shown in FIG. 6A, where the incoming signal at point A in the wire is buffered by inverter 610 and 620 in series. The two inverters are sized appropriately to drive a long segment of wire starting at B node of the wire. The buffer may drive more than one wire. A programmable bi-directional buffer from U.S. Pat. No. 4,870,302 shown in FIG. 6B has two such back-to-back buffers gated by two pass-gate logic elements 630 and 640. Unlike the full CMOS signal drive at point B in FIG. 6A, the buffers in FIG. 6B has many draw backs: (i) threshold voltage (Vt) drop in passing voltage power (Vcc) level, (ii) boosted pass-gate signal level over Vcc if not to lose Vt drop, (iii) larger area CMOS pass-gate if not to lose Vt drop, (iv) pass-gate ON resistance impacting signal delay and (v) very wide width of pass-gate (hence large area) to minimize ON resistance. An inexpensive programmable buffer to eliminate these draw backs is highly desirable for FPGA's. None of the prior teachings demonstrate how to implement programmable buffers to overcome these deficiencies.

A useful measure of a programmable circuit is the gate comparison to an equivalent application specific circuit. SRAM based programmable pass-gates have to absorb the transistor overhead in the SRAM memory element. This can be easily seen in a 4 point switch in FIG. 6C discussed in Ref-3 (Betz, Rose & Marquardt) and U.S. Pat. No. 4,870, 302. The switch in FIG. 6C is a simple extension of the 3:1 MUX for 4 points. An ASIC will connect two points with a direct connection inside the circle. This programmable alternative has 6 wide pass-gate devices (such as 652) and 6 SRAM devices (such as 651). The SRAM (similar to FIG. 4A) overhead is 36 transistors, while the pass-gate overhead is 6 transistors. Such an overhead is extremely uneconomical for modern FPGA's that require some level of reasonable cost parity to an ASIC. In most programmable devices, after the user has finalized the logic design, it is rarely or never changed. For such designs, a conversion from programmable to application specific is highly desirable. The referenced usages do not lend to an easy economical conversion.

What is desirable is to have inexpensive, fast and timing predictable routing block to connect logic elements. These routing connections need to facilitate short wire connections and long wire connections and then preserve timing in a predictable and calculable manner. It is also beneficial to have the ability to program the data flow direction, and have this configurability integrated into configuration circuits. Furthermore, the drawbacks discussed earlier for bi-directional wires must be eliminated to improve fitting. Such a routing block should have reasonable cost parity to ASICs and also lend to an easy application specific design conversion to the user, preserving the original timing characteristics of the circuit during the conversion.

SUMMARY

In one aspect, a programmable interconnect structure for an integrated circuit comprises: a pass-gate fabricated on a substrate layer to electrically connect a first node to a second node; and a configuration circuit including at least one memory element to control said pass-gate fabricated substantially above said substrate layer; and a programmable method to select between isolating said first and second nodes and connecting said first and second nodes.

Implementations of the above aspect may include one or more of the following. An interconnect structure is a switch. Most common device is a pass-gate. A pass-gate is an NMOS transistor, a PMOS transistor or a CMOS transistor pair that can electrically connects two points. Other methods of connecting two points include fuse links and anti-fuse capacitors. The gate electrode signal on these pass-gates allows a programmable method of controlling an on and off connection. A plurality of pass-gate logic is included in a programmable logic device. The logic device comprises circuits consisting of CMOS transistors that include AND, NAND, OR, NOR and pass-gate type logic structures. Multiple logic circuits are combined into larger logic blocks. Configuration circuits are used to change programmable logic functionality. Configuration circuits have memory elements and access circuitry to change memory data. Each memory element can be a transistor or a diode or a group of electronic devices. The memory elements can be made of CMOS devices, capacitors, diodes on a substrate. The memory elements can be made of thin film devices such as thin film transistors (TFT), capacitors and diodes. The memory element can be selected from the group consisting of volatile and non volatile memory elements. The memory element can also be selected from the group of fuses, antifuses, SRAM cells, DRAM cells, optical cells, metal optional links, EPROMs, EEPROMs, flash, magnetic and ferro-electric elements. One or more redundant memory elements can be provided for controlling the same circuit block. The memory element can generate an output signal to control logic gates. Memory element can generate a signal that is used to derive a control signal. The control signal is coupled to pass-gate logic element, AND array, NOR array, a MUX or a Look-Up-Table (LUT) logic. Configuration circuits take a large Silicon foot print. This adds to the cost of programmable logic compared to a similar functionality application specific device. Reducing configuration circuit Silicon usage helps reduce programmable logic cost. A 3-dimensional integration of configuration circuits provides such a cost reduction. Logic circuits are fabricated using a basic logic process capable of making CMOS transistors. The pass-gates are formed on P-type, N-type, epi or SOI substrate wafers. The configuration circuits may be formed above the logic transistors. This may be achieved by inserting a thin-film transistor (TFT) module at contact layer of the logic process. The thin-film transistor outputs may be directly coupled to gate electrodes of pass-gates on substrate to provide logic control. Buried contacts may be used to make these connections. The contacts may be filled with doped poly-silicon, Titanium-Tungsten, Tungsten Silicide, or some other refractory metal. Memory elements may be constructed also with TFT transistors, capacitors and diodes. The TFT layers may be restricted for only configuration circuits, not used for logic signal lines. Metal layers above the TFT layers may be used for all the routing for the storage device, and configuration device. All signal paths may utilize wires and storage circuitry with no impact from TFT layers used for configuration circuits. This simple pass-gate switch with a vertically integrated configuration circuit reduces programmable logic cost.

In a second aspect, a programmable buffer structure for an integrated circuit comprises: a first and a second terminal; and a programmable pull-up and a programmable pull-down circuit coupled between said first and second terminals; and a configuration circuit including at least one memory element coupled to said pull-up and pull-down circuits; and a programmable method to select between isolating said first terminal from second terminal by deactivating said pull-up and pull-down circuits, and coupling said first terminal to second terminal by activating said pull-up and pull-down circuits.

Implementations of the above aspect may include one or more of the following. A buffer is a circuit to amplify a signal. A simple buffer is two inverters in series, sized sequentially larger to generate a high drive current. Buffer output polarity can be the same or opposite of that at input. Odd and even number of stages determine the polarity. A buffer is used to transmit signals in long wires, or wires comprising a high capacitive load. A wire carries data in one direction, from a source to a sink node. A programmable wire allows the direction of data flow to be chosen by the user. A programmable buffer allows bi-directional data flow to facilitate long wire connections in programmable logic. Application specific logic also utilizes buffers to amplify signals. A 3-dimentionally integrated programmable buffer allows a technique to reach within 2× area of an application specific buffer. Existing FPGA techniques utilizing a 6 pass-gate Bridge with 42 transistors to replace a single via in an application specific device is simply not economical for future FPGA designs.

In a third aspect, a method of forming a programmable interconnect structure for an integrated circuit comprises: fabricating one or more pass-gates on a substrate layer to electrically connect two points; and selectively fabricating either a memory circuit or a conductive pattern substantially above said pass-gates to control a portion of said pass-gates; and fabricating an interconnect and routing layer substantially above said memory circuits to connect said pass-gates and one of said memory circuits and conductive pattern.

Implementations of the above aspect may further include one or more of the following. The memory element can be selected from the group consisting of volatile or non volatile memory elements. The memory can be implemented using a TFT process technology that contains one or more of Fuses, Anti-fuses, DRAM, EPROM, EEPROM, Flash, Ferro-Electric, optical, magnetic and SRAM elements. Configuration circuits may include thin film elements such as diodes, transistors, resistors and capacitor. The process implementation is possible with any memory technology where the programmable element is vertically integrated in a removable module. The configuration circuit includes a predetermined conductive pattern in lieu of memory elements to control the programmable logic in the storage circuits. Multiple memory bits exist to customize logic functions. Each memory bit pattern has a corresponding unique conductive pattern to duplicate the same customized logic function. Circuit performance of the logic function is not affected by the choice of logic control: memory elements or conductive pattern.

Implementations of the above aspects may include one or more of the following. The interconnect device constitutes fabricating a VLSI IC product. The IC product is re-programmable in its initial stage with turnkey conversion to an ASIC. The IC has the end ASIC cost structure and FPGA re-programmability. The IC product offering occurs in two phases: the first stage is a generic FPGA that has re-programmability containing a programmable module, and the second stage is an ASIC with the entire programmable module replaced by 1 to 2 customized hard-wire masks.

A series product families can be provided with a modularized programmable element in an FPGA version followed by a turnkey custom ASIC with the same base die with 1–2 custom masks. The vertically integrated programmable module does not consume valuable silicon real estate of a base die. Furthermore, the design and layout of these product families adhere to removable module concept: ensuring the functionality and timing of the product in its FPGA and ASIC canonicals. These IC products can replace existing PLD and FPGA products and compete with existing Gate Arrays and ASIC's in cost and performance.

An easy turnkey customization of an ASIC from an original smaller cheaper and faster PLD or FPGA would greatly enhance time to market, performance, and product reliability.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 12 shows constructional process cross sections of a TFT process.

FIG. 14A shows a first embodiment of a programmable transmit buffer.

FIG. 14B shows the symbol for the programmable transmit buffer.

FIG. 14C shows a second embodiment for a programmable transmit buffer.

FIG. 16A shows a first embodiment of a programmable transmit/receive buffer.

FIG. 16B shows the symbol for the programmable transmit/receive buffer.

FIG. 16C shows a second embodiment for a programmable transmit/receive buffer.

DESCRIPTION

Figure 1:
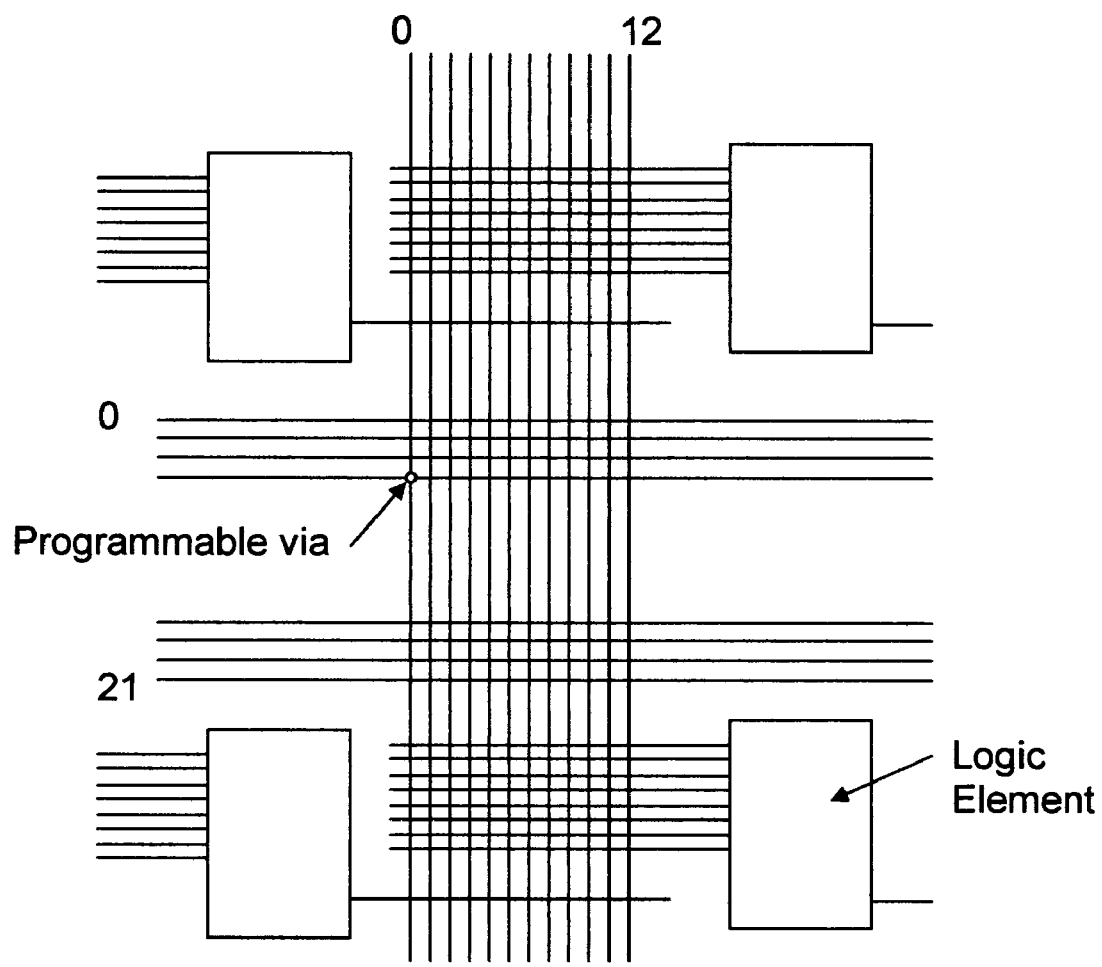
FIG. 1 shows an exemplary interconnect structure utilizing a logic element.
Figure 2:
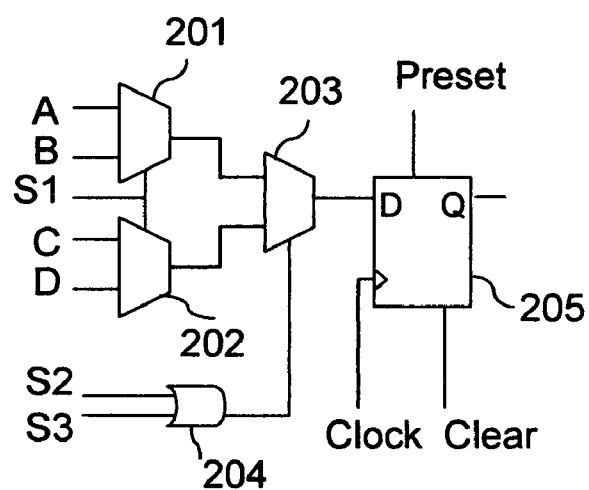
FIG. 2 shows an exemplary logic element.

In the following detailed description of the invention, reference is made to the accompanying drawings which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

Definitions: The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, SOI material as well as other semiconductor structures well known to one skilled in the art. The term conductor is understood to include semiconductors, and the term insulator is defined to include any material that is less electrically conductive than the materials referred to as conductors.

The term module layer includes a structure that is fabricated using a series of predetermined process steps. The boundary of the structure is defined by a first step, one or more intermediate steps, and a final step. The resulting structure is formed on a substrate.

The term pass-gate refers to a structure that can pass a signal when on, and blocks signal passage when off. A pass-gate connects two points when on, and disconnects two points when off. A pass-gate can be a floating-gate transistor, an NMOS transistor, a PMOS transistor or a CMOS transistor pair. The gate electrode of pass-gate determines the state of the connection. A CMOS pass-gate requires complementary signals coupled to NMOS and PMOS gate electrodes. A control logic signal is connected to gate electrode of a pass-gate for programmable logic.

The term configuration circuit includes one or more configurable elements and connections that can be programmed for controlling one or more circuit blocks in accordance with a predetermined user-desired functionality. The configuration circuit includes the memory element and the access circuitry, herewith called memory circuitry, to modify said memory element. Configuration circuit does not include the logic pass-gate controlled by said memory element. In one embodiment, the configuration circuit includes a plurality of memory circuits to store instructions to configure an FPGA. In another embodiment, the configuration circuit includes a first selectable configuration where a plurality of memory circuits is formed to store instructions to control one or more circuit blocks. The configuration circuits include a second selectable configuration with a predetermined conductive pattern formed in lieu of the memory circuit to control substantially the same circuit blocks. The memory circuit includes elements such as diode, transistor, resistor, capacitor, metal link, among others. The memory circuit also includes thin film elements. In yet another embodiment, the configuration circuits include a predetermined conductive pattern, via, resistor, capacitor or other suitable circuits formed in lieu of the memory circuit to control substantially the same circuit blocks.

The term "horizontal" as used in this application is defined as a plane parallel to the conventional plane or surface of a wafer or substrate, regardless of the orientation of the wafer or substrate. The term "vertical" refers to a direction perpendicular to the horizontal direction as defined above. Prepositions, such as "on", "side", "higher", "lower", "over" and "under" are defined with respect to the conventional plane or surface being on the top surface of the wafer or substrate, regardless of the orientation of the wafer or substrate. The following detailed description is, therefore, not to be taken in a limiting sense.

Figure 3A:
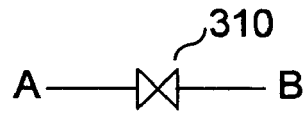
FIG. 3A shows an exemplary fuse link point to point connection.
Figure 3B:
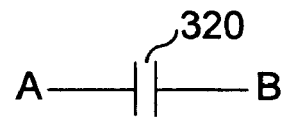
FIG. 3B shows an exemplary anti-fuse point to point connection.
Figure 3C:
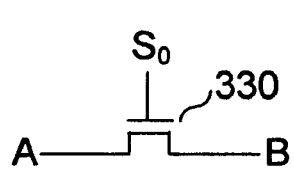
FIG. 3C shows an exemplary pass-gate point to point connection.
Figure 3D:
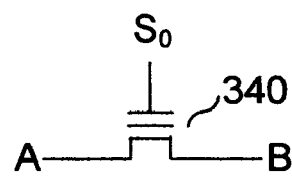
FIG. 3D shows an exemplary floating-pass-gate point to point connection.

A point to point connection can be made utilizing programmable pass-gate logic as shown in FIG. 3C and FIG. 3D. Multiple inputs (node A) can be connected to multiple outputs (node B) with a plurality of pass-gate logic elements. An SRAM base connection is shown in FIG. 4, where pass-gate 430 can be a PMOS or an NMOS transistor. NMOS is preferred due to its higher conduction. The gate voltage $S_0$ on NMOS transistor 410 gate electrode determines an ON or OFF connection. That logic level is generated by a configuration circuit 450 coupled to the gate of NMOS transistor 410. The pass-gate logic connection requires the configuration circuitry to generate signal $S_0$ with sufficient voltage levels to ensure off and on conditions. For an NMOS pass-gate, $S_0$ having a logic level one completes the point to point connection, while a logic level zero keeps them disconnected. In addition to using only an NMOS gate, a PMOS gate could also be used in parallel to make the connection. The configuration circuit 450 needs to then provide complementary outputs ($S_0$ and $S_0$') to drive NMOS and PMOS gates in the connection. Configuration circuit 450 contains a memory element. Most CMOS SRAM memory delivers complementary outputs. This memory element can be configured by the user to select the polarity of $S_0$, thereby selecting the status of the connection. The memory element can be volatile or non-volatile. In volatile memory, it could be DRAM, SRAM, Optical or any other type of a memory device that can output a valid signal $S_0$. In non-volatile memory it could be fuse, anti-fuse, EPROM, EEPROM, Flash, Ferro-Electric, Magnetic or any other kind of memory device that can output a valid signal $S_0$. The output $S_0$ can be a direct output coupled to the memory element, or a derived output in the configuration circuitry. An inverter can be used to restore $S_0$ signal level to full rail voltage levels. The SRAM in configuration circuit 450 can be operated at an elevated Vcc level to output an elevated $S_0$ voltage level. This is especially feasible when the SRAM is built in a separate TFT module. Other configuration circuits to generate a valid $S_0$ signal are discussed next.

Figure 7:
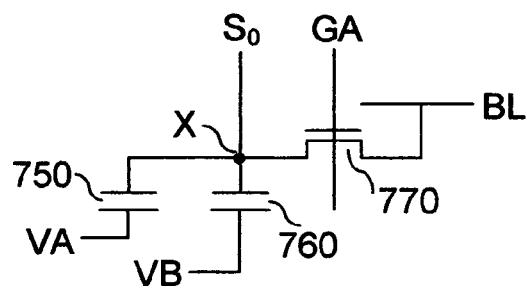
FIG. 7 shows a configuration circuit utilizing anti-fuse memory elements.

An anti-fuse based configuration circuit to use with this invention is shown next in FIG. 7. Configuration circuit 450 in FIG. 4B can be replaced with the anti-fuse circuit shown in FIG. 7. In FIG. 7, output level $S_0$ is generated from node X which is coupled to signals VA and VB via two anti-fuses 750 and 760 respectively. Node X is connected to a programming access transistor 770 controlled by gate signal GA and drain signal BL. A very high programming voltage is needed to blow the anti-fuse capacitor. This programming voltage level is determined by the anti-fuse properties, including the dielectric thickness. Asserting signal VA very high, VB low (typically ground), BL low and GA high (Vcc to pass the ground signal) provides a current path from VA to BL through the on transistor 770. A high voltage is applied across anti-fuse 750 to pop the dielectric and short the terminals. Similarly anti-fuse 760 can be programmed by selecting VA low, VB very high, BL low and GA high. Only one of the two anti-fuses is blown to form a short. When the programming is done, BL and GA are returned to zero, isolating node X from the programming path. VA=Vss (ground) and VB=Vcc (power, or elevated Vcc) is applied to the two signal lines. Depending on the blown fuse, signal $S_0$ will generate a logic low or a logic high signal. This is a one time programmable memory device. Node X will be always connected to VA or VB by the blown fuse regardless of the device power status. Signals GA and BL are constructed orthogonally to facilitate row and column based decoding to construct these memory elements in an array.

Figure 8A:
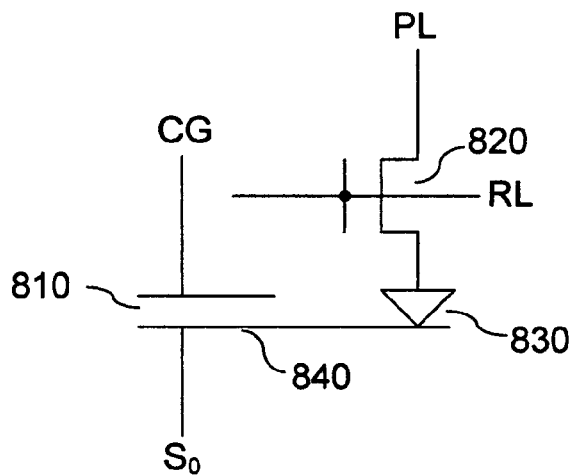
FIG. 8A shows a first embodiment of a configuration circuit utilizing a floating-gate.
Figure 8B:
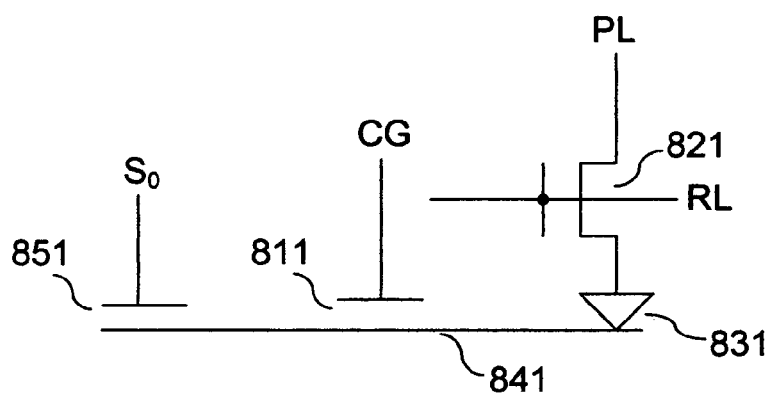
FIG. 8B shows a second embodiment of a configuration circuit utilizing a floating-gate.

FIG. 8 shows two EEPROM non-volatile configuration circuits that can be used in this invention. Configuration circuit 450 in FIG. 4B can be replaced with either of two EEPROM circuit shown in FIG. 8A and FIG. 8B. In FIG. 8, node 840 is a floating gate. This is usually a poly-silicon film isolated by an insulator all around. It is coupled to the source end of programming transistor 820 via a tunneling diode 830. The tunneling diode is a thin dielectric capacitor between floating poly and substrate silicon with high doping on either side. When a large programming (or erase) voltage Vpp is applied across the thin dielectric, a Fowler-Nordheim tunneling current flows through the oxide. The tunneling electrons move from electrical negative to electrical positive voltage. Choosing the polarity of the applied voltage across the tunneling dielectric, the direction of electron flow can be reversed. Multiple programming and erase cycles are possible for these memory elements. As the tunneling currents are small, the high programming voltage (Vpp) can be generated on chip, and the programming and erasure can be done while the chip is in a system. It is hence called in system programmable (ISP). An oxide or dielectric capacitor 810 couples the floating gate (FG) 840 to a control gate (CG). The control gate CG can be a heavily doped silicon substrate plate or a second poly-silicon plate above the floating poly. The dielectric can be oxide, nitride, ONO or any other insulating material. A voltage applied to CG will be capacitively coupled to FG node 840. The coupling ratio is designed such that 60–80 percent of CG voltage will be coupled to FG node 840. To program this memory element, a negative charge must be trapped on the FG 840. This is done by applying positive Vpp voltage on CG, ground voltage on PL and a sufficiently high (Vcc) voltage on RL. CG couples a high positive voltage onto FG 840 creating a high voltage drop across diode 830. Electrons move to the FG 840 to reduce this electric field. When the memory device is returned to normal voltages, a net negative voltage remains trapped on the FG 840. To erase the memory element, the electrons must be removed from the floating gate. This can be done by UV light, but an electrical method is more easily adapted. The CG is grounded, a very high voltage (Vpp+more to prevent a threshold voltage drop across 820) is applied to RL, and a very high voltage (Vpp) is applied to PL. Now a low voltage is coupled to FG with a very high positive voltage on the source side of device 820. Diode 830 tunneling removes electrons from FG. This removal continues beyond a charge neutral state for the isolated FG. When the memory device is returned to normal voltages, a net positive voltage remains trapped on the FG 840. Under normal operation RL is grounded to isolate the memory element from the programming path, and PL is grounded. A positive intermediate voltage Vcg is applied to CG terminal. FG voltage is denoted $S_0$. Under CG bias, $S_0$ signal levels are designed to activate pass-gate logic correctly. Configuration circuit in FIG. 8B is only different to that in FIG. 8A by the capacitor 851 used to induce $S_0$ voltage. This is useful when $S_0$ output is applied to leaky pass-gates, or low level leakage nodes. As gate oxide thicknesses reach below 50 angstroms, the pass-gates leak due to direct tunneling.

Figure 9:
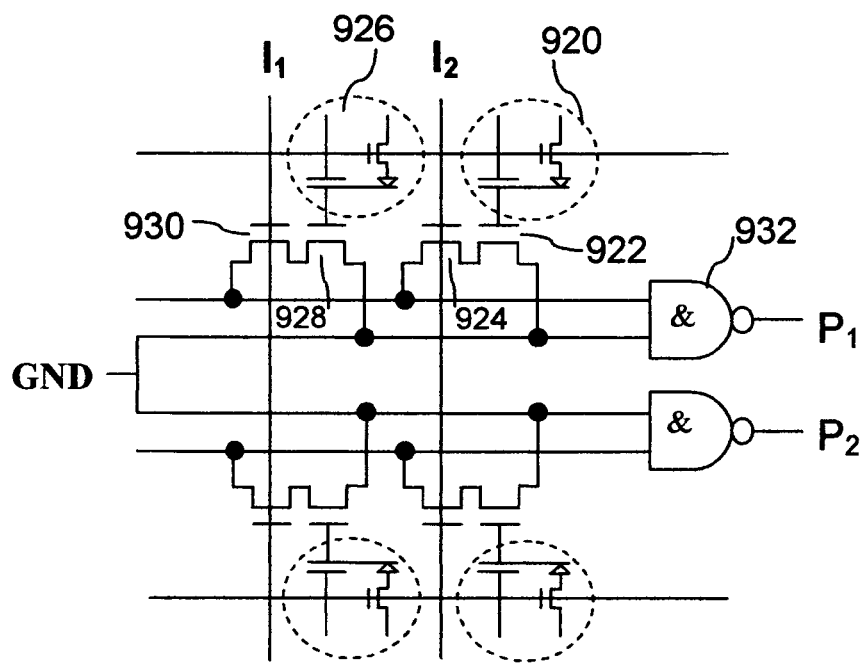
FIG. 9 shows a programmable AND array realization of floating-gate based memory elements.

These configuration circuits, and similarly constructed other configuration circuits, can be used in programmable logic devices. Those with ordinary skill in the art may recognize other methods for constructing configuration circuits to generate a valid $S_0$ output. FIG. 9 shows an EEPROM non-volatile memory element in the implementation of a Product-Term, also known as P-Term, in NAND-NOR logic. FIG. 9 shows two mirrored P-Term outputs P1 and P2. For output P1, an NAND gate 932 comprised of a pull-up device receives signals from pull down pass transistors 922, 924, 928 and 930. The pass transistor 922 is controlled by block 920 shown in the dashed circle, while the pass transistor 928 is controlled by a similar block 926 shown inside the dashed circle. These blocks 920 and 926 show the configuration circuits shown in FIG. 8A. Blocks 920 and 926 can be replaced by any one of configuration circuits shown in FIG. 4A, FIG. 7 or FIG. 8B to realize this logic function. Pass transistors 922, 924, 928, 930 and the NAND gate 932 show the logic block of the PLD. The logic block is not affected by the choice of the configuration circuit. This voltage output level applied to the gate of device 922 is designed to turn the device off or on at a designed control gate (CG) operating voltage.

Figure 4A:
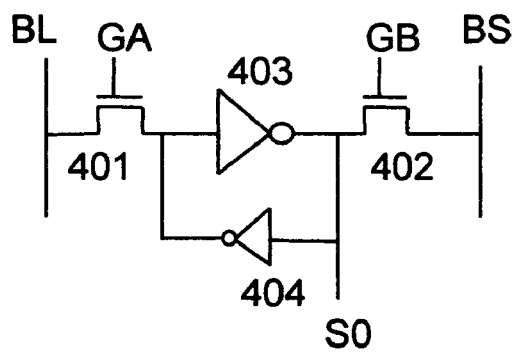
FIG. 4A shows an exemplary configuration circuit for a 6T SRAM element.

SRAM memory technology has the advantage of not requiring a high voltage to configure memory. The SRAM based switch shown in FIG. 4B containing the SRAM memory circuit shown in FIG. 4A utilizes 6 extra configuration transistors, discounting the pass-gate 410, to provide the programmability. That is a significant overhead compared to application specific circuits where the point to point connection can be directly made with metal. Similarly other programmable memory elements capable of configuring pass-gate logic also carry a high silicon foot print. A cheaper method of constructing a vertically integrated SRAM cell is described in application Ser. No. 10/413,810 entitled "Semiconductor Latches and SRAM Devices", filed on Apr. 14, 2003 and list as inventor Mr. R. U. Madurawe, the contents of which are incorporated herein by reference. In a preferred embodiment, the configuration circuit is built on thin-film semiconductor layers located vertically above the logic circuits. The SRAM memory element, a thin-film transistor (TFT) CMOS latch as shown in FIG. 4A, comprises two lower performance back to back inverters formed on two semiconductor thin film layers, substantially different from a first semiconductor single crystal substrate layer and a gate poly layer used for logic transistor construction. This latch is stacked above the logic circuits for slow memory applications with no penalty on Silicon area and cost. This latch is adapted to receive power and ground voltages in addition to configuration signals. The two programming access transistors for the TFT latch are also formed on thin-film layers. Thus in FIG. 4B, all six configuration transistors shown in 450 are constructed in TFT layers, vertically above the pass transistor 410. Transistor 410 is in the conducting path of the connection and needs to be a high performance single crystal Silicon transistor. This vertical integration makes it economically feasible to add an SRAM based configuration circuit at a very small cost overhead to create a programmable solution. Such vertical integration can be extended to all other memory elements that can be vertically integrated above logic circuits.

A new kind of a programmable logic device utilizing thin-film transistor configurable circuits is disclosed in application Ser. No. 10/267,483 entitled "Three Dimensional Integrated Circuits", application Ser. No. 10/267,484 entitled "Methods for Fabricating Three-Dimensional Integrated Circuits", and application Ser. No. 10/267,511 entitled "Field Programmable Gate Array With Convertibility to Application Specific Integrated Circuit", all of which were filed on Oct. 8, 2002 and list as inventor Mr. R. U. Madurawe, the contents of which are incorporated-by-reference. The disclosures describe a programmable logic device and an application specific device fabrication from the same base Silicon die. The PLD is fabricated with a programmable memory module, while the ASIC is fabricated with a conductive pattern in lieu of the memory. Both memory module and conductive pattern provide identical control of logic circuits. For each set of memory bit patterns, there is a unique conductive pattern to achieve the same logic functionality. The vertical integration of the configuration circuit leads to a significant cost reduction for the PLD, and the elimination of TFT memory for the ASIC allows an additional cost reduction for the user. The TFT vertical memory integration scheme is briefly described next.

Figure 10:
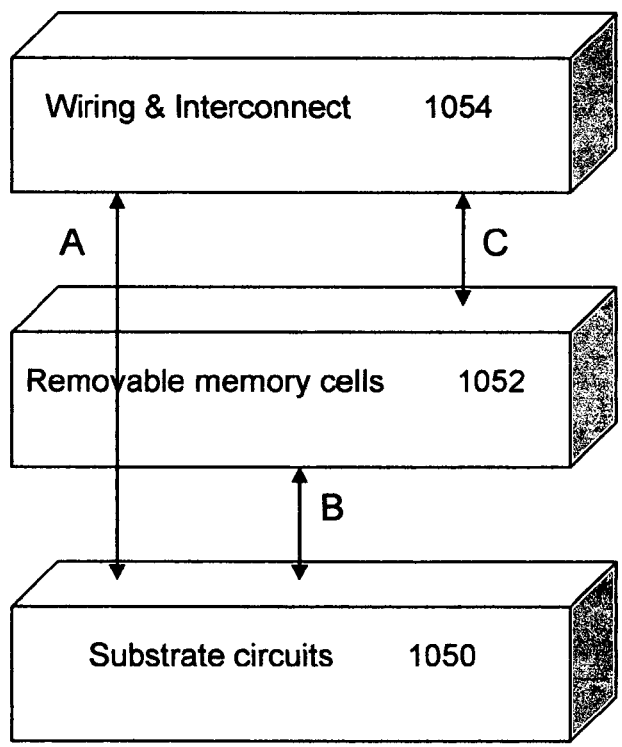
FIG. 10 shows a 3-dimensional construction of a programmable device.

FIG. 10 shows an implementation of vertically integrated circuits, where the configuration memory element is located above logic. The memory element can be any one of fuse links, anti-fuse capacitors, SRAM cells, DRAM cells, metal optional links, EPROM cells, EEPROM cells, flash cells, ferro-electric elements, optical elements and magnetic elements that lend to this implementation. SRAM memory is used herein to illustrate the scheme and is not to be taken in a limiting sense. First, silicon transistors 1050 are deposited on a substrate. A module layer of removable SRAM cells 1052 are positioned above the silicon transistors 1050, and a module layer of interconnect wiring or routing circuit 1054 is formed above the removable memory cells 1052. To allow this replacement, the design adheres to a hierarchical layout structure. As shown in FIG. 10, the SRAM cell module is sandwiched between the single crystal device layers below and the metal layers above electrically connecting to both. It also provides through connections "A" for the lower device layers to upper metal layers. The SRAM module contains no switching electrical signal routing inside the module. All such routing is in the layers above and below. Most of the programmable element configuration signals run inside the module. Upper layer connections to SRAM module "C" are minimized to Power, Ground and high drive data wires. Connections "B" between SRAM module and single crystal module only contain logic level signals and replaced later by Vcc and Vss wires. Most of the replaceable programmable elements and its configuration wiring is in the "replaceable module" while all the devices and wiring for the end ASIC is outside the "replaceable module". In other embodiments, the replaceable module could exist between two metal layers or as the top most module layer satisfying the same device and routing constraints. This description is equally applicable to any other configuration memory element, and not limited to SRAM cells.

Fabrication of the IC also follows a modularized device formation. Formation of transistors 1050 and routing 1054 is by utilizing a standard logic process flow used in the ASIC fabrication. Extra processing steps used for memory element 1052 formation are inserted into the logic flow after circuit layer 1050 is constructed. A full disclosure of the vertical integration of the TFT module using extra masks and extra processing is in the incorporated by reference applications discussed above.

During the customization, the base die and the data in those remaining mask layers do not change making the logistics associated with chip manufacture simple. Removal of the SRAM module provides a low cost standard logic process for the final ASIC construction with the added benefit of a smaller die size. The design timing is unaffected by this migration as lateral metal routing and silicon transistors are untouched. Software verification and the original FPGA design methodology provide a guaranteed final ASIC solution to the user. A full disclosure of the ASIC migration from the original FPGA is in the incorporated by reference applications discussed above.

Figure 4B:
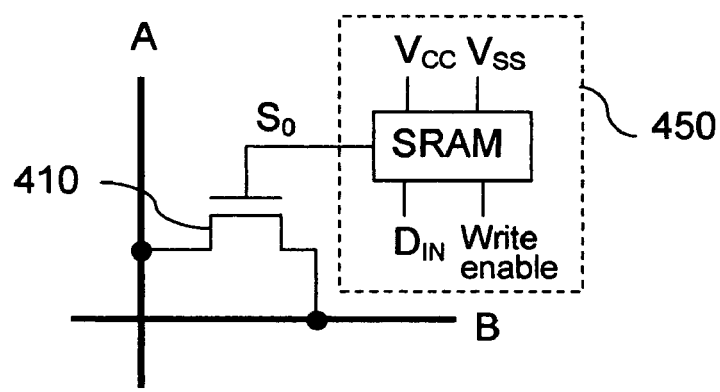
FIG. 4B shows an exemplary programmable pass-gate switch with SRAM memory.
Figure 5B:
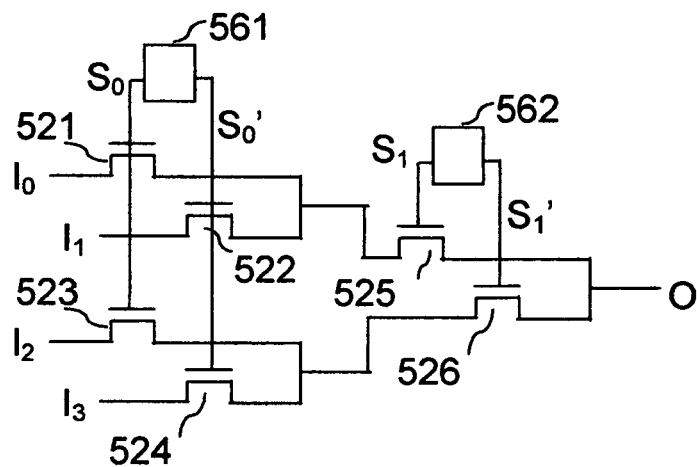
FIG. 5B shows an exemplary 4:1 MUX controlled by 2 bits.
Figure 5A:
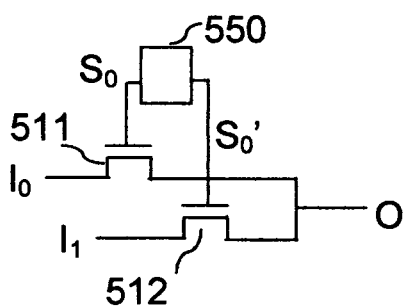
FIG. 5A shows an exemplary 2:1 MUX controlled by one bit.
Figure 11A:
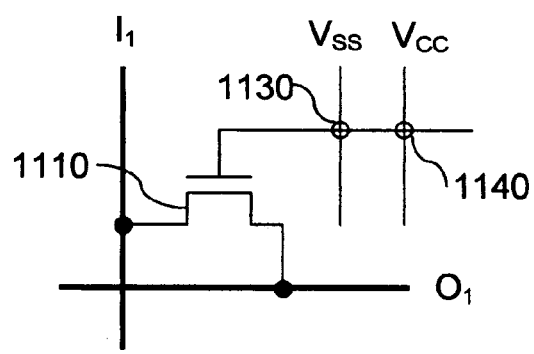
FIG. 11A shows a hard-wire mapping for a programmable pass-gate.
Figure 11B:
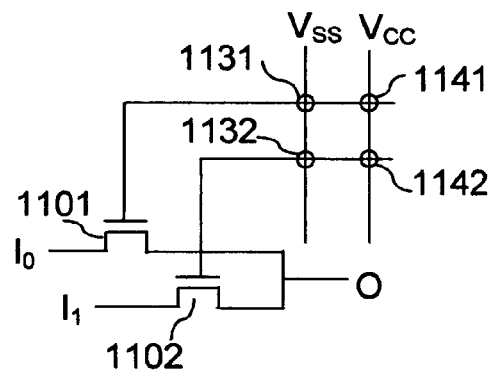
FIG. 11B shows a hard-wire mapping for a programmable 2:1 MUX.

The ASIC migration path for the point to point connection in FIG. 4B and the 2:1 MUX in FIG. 5A are illustrated in FIG. 11A and FIG. 11B respectively. In FIG. 11A, the gate input signal to pass-gate 1110 is mapped to two possible conductive pattern connections: connection 1130 to Vss and connection 1140 to Vcc. The connections are made in metal or contacts between metal during the fabrication process. Based on the $S_0$ output state being 0 or 1 of a memory pattern to map into a conductive pattern, either Vss or the Vcc connection is chosen. For each memory bit state, only one conductive pattern connection is made. Similarly in FIG. 11B, pass-gate 1101 has conductive pattern options to Vss and Vcc at nodes 1131 and 1141 respectively. Pass-gate 1102 has conductive pattern options to Vss and Vcc at nodes 1132 and 1142 respectively. Neither or one of $I_0$ and $I_1$ can be connected to 0 from this option. Comparing FIG. 4A with FIG. 11A and FIG. 9A with FIG. 11B, the point to point connection is identical between the two configuration options: memory element and conductive pattern. The signal delay through these pass-gate connections also remains identical, independent of the control option. Timing characteristics of complex designs utilizing a plurality of these switches also stay intact during the conversion.

In a second embodiment for the conductive pattern, the pass-gate 1110 drain is shorted to source in FIG. 11A by a metal wire when $S_0=1$. Wire resistance is reduced by eliminating pass-gate 1110 ON resistance from the signal path. When $S_0=0$, the pass-gate is left connected to Vss to eliminate floating nodes. The signal delay will be altered between the conducting pattern and memory options. That change can be emulated in the FPGA by raising only SRAM memory Vcc, raising $S_0$ voltage to reduce 1110 ON resistance. As the FPGA is not meant for manufacturing under this scenario, time dependant die electric breakdown (TDDB) driven reliability is not an issue. This may be desirable to users who need higher performance tweak for the ASIC and field test the tweak for no other timing violations prior to conversion.

In FIG. 10, the third module layer is formed substantially above the first and second module layers, wherein interconnect and routing signals are formed to connect the circuit blocks within the first and second module layers. Alternatively, the third module layer can be formed substantially below the first and second module layer with interconnect and routing signals formed to connect the circuit blocks within the first and second module layers. Alternatively, the third and fourth module layers positioned above and below the second module layer respectively, wherein the third and fourth module layers provide interconnect and routing signals to connect the circuit blocks within the first and second module layers.

In yet another embodiment of a programmable multi-dimensional semiconductor device, a first module layer is fabricated having a plurality of circuit blocks formed on a first plane. The programmable multi dimensional semiconductor device also includes a second module layer formed on a second plane. A plurality of configuration circuits is then formed in the second plane to store instructions to control a portion of the circuit blocks.

The fabrication of thin-film transistors to construct configuration circuits is discussed next. A full disclosure is provided in application Ser. No. 10/413,809 entitled "Semiconductor Switching Devices", filed on Apr. 14, 2003 which lists as inventor Mr. R. U. Madurawe, the contents of which are incorporated herein by reference.

The following terms used herein are acronyms associated with certain manufacturing processes. The acronyms and their abbreviations are as follows:

$V_T$ Threshold voltage
LDN Lightly doped NMOS drain
LDP Lightly doped PMOS drain
LDD Lightly doped drain
RTA Rapid thermal annealing
Ni Nickel
Ti Titanium
TiN Titanium-Nitride
W Tungsten
S Source
D Drain
G Gate
ILD Inter layer dielectric
C1 Contact-1
M1 Metal-1
P1 Poly-1
P− Positive light dopant (Boron species, $BF_2$)
N− Negative light dopant (Phosphorous, Arsenic)
P+ Positive high dopant (Boron species, $BF_2$)
N+ Negative high dopant (Phosphorous, Arsenic)
Gox Gate oxide
C2 Contact-2
LPCVD Low pressure chemical vapor deposition
CVD Chemical vapor deposition
ONO Oxide-nitride-oxide
LTO Low temperature oxide A logic process is used to fabricate CMOS devices on a substrate layer for the fabrication of storage circuits. These CMOS devices may be used to build AND gates, OR gates, inverters, adders, multipliers, memory and pass-gate based logic functions in an integrated circuit. A CMOSFET TFT module layer or a Complementary gated FET (CGated-FET) TFT module layer may be inserted to a logic process at a first contact mask to build a second set of TFT MOSFET or Gated-FET devices. Configuration circuitry is build with these second set of transistors. An exemplary logic process may include one or more following steps:

P-type substrate starting wafer
Shallow Trench isolation: Trench Etch, Trench Fill and CMP
Sacrificial oxide
PMOS $V_T$ mask & implant
NMOS $V_T$ mask & implant
Pwell implant mask and implant through field
Nwell implant mask and implant through field
Dopant activation and anneal
Sacrificial oxide etch
Gate oxidation/Dual gate oxide option
Gate poly (GP) deposition
GP mask & etch
LDN mask & implant
LDP mask & implant
Spacer oxide deposition & spacer etch
N+ mask and NMOS N+ G, S, D implant
P+mask and PMOS P+ G, S, D implant
Ni deposition
RTA anneal—Ni salicidation (S/D/G regions & interconnect)
Unreacted Ni etch
ILD oxide deposition & CMP FIG. 12 shows an exemplary process for fabricating a thin film MOSFET latch in a module layer. In one embodiment the process in FIG. 12 forms the latch in a layer substantially above the substrate layer. The processing sequence in FIG. 12.1 through 12.7 describes the physical construction of a MOSFET device for storage circuits 450 shown in FIG. 4B. The process of FIG. 12 includes adding one or more following steps to the logic process after ILD oxide CMP step.

C1 mask & etch
W-Silicide plug fill & CMP
~300 A poly P1 (crystalline poly-1) deposition
P1 mask & etch
Blanket Vtn P− implant (NMOS Vt)
Vtp mask & N− implant (PMOS Vt)
TFT Gox (70 A PECVD) deposition
500 A P2 (crystalline poly-2) deposition
P2 mask & etch
Blanket LDN NMOS N− tip implant
LDP mask and PMOS P− tip implant
Spacer LTO deposition
Spacer LTO etch to form spacers & expose P1
Blanket N+ implant (NMOS G/S/D & interconnect)
P+ mask & implant (PMOS G/S/D & interconnect)
Ni deposition
RTA salicidation and poly re-crystallization (G/S/D regions & interconnect)
Dopant activation anneal
Excess Ni etch
ILD oxide deposition & CMP
C2 mask & etch
W plug formation & CMP
M1 deposition and back end metallization The TFT process technology consists of creating NMOS & PMOS poly-silicon transistors. In the embodiment in FIG. 12, the module insertion is after the substrate device gate poly etch and the ILD film is deposition. In other embodiments the insertion point may be after M1 and the ILD is deposition, prior to V1 mask, or between two metal definition steps.

After gate poly of regular transistors are patterned and etched, the poly is salicided using Nickel & RTA sequences. Then the ILD is deposited, and polished by CMP techniques to a desired thickness. In the shown embodiment, the contact mask is split into two levels. The first C1 mask contains all contacts that connect latch outputs to substrate transistor gates and active nodes. Then the C1 mask is used to open and etch contacts in the ILD film. Ti/TiN glue layer followed by W-Six plugs, W plugs or Si plugs may be used to fill the plugs, then CMP polished to leave the fill material only in the contact holes. The choice of fill material is based on the thermal requirements of the TFT module.

Then, a first P1 poly layer, amorphous or crystalline, is deposited by LPCVD to a desired thickness as shown in FIG. 12.1. The P1 thickness is between 50 A and 1000 A, and preferably 250 A. This poly layer P1 is used for the channel, source, and drain regions for both NMOS and PMOS TFT's. It is patterned and etched to form the transistor body regions. In other embodiments, P1 is used for contact pedestals. NMOS transistors are blanket implanted with P– doping, while the PMOS transistor regions are mask selected and implanted with N– doping. This is shown in FIG. 12.2. The implant doses and P1 thickness are optimized to get the required threshold voltages for PMOS & NMOS devices under fully depleted transistor operation, and maximize on/off device current ratio. The pedestals implant type is irrelevant at this point. In another embodiment, the $V_T$ implantation is done with a mask P– implant followed by masked N– implant. First doping can also be done in-situ during poly deposition or by blanket implant after poly is deposited.

Patterned and implanted P1 may be subjected to dopant activation and crystallization. In one embodiment, RTA cycle is used to activate & crystallize the poly after it is patterned to near single crystal form. In a second embodiment, the gate dielectric is deposited, and buried contact mask is used to etch areas where P1 contacts P2 layer. Then, Ni is deposited and salicided with RTA cycle. All of the P1 in contact with Ni is salicided, while the rest poly is crystallized to near single crystal form. Then the unreacted Ni is etched away. In a third embodiment, amorphous poly is crystallized prior to P1 patterning with an oxide cap, metal seed mask, Ni deposition and MILC (Metal-Induced-Lateral-Crystallization).

Then the TFT gate dielectric layer is deposited followed by P2 layer deposition. The dielectric is deposited by PECVD techniques to a desired thickness in the 30–200 A range, desirably 70 A thick. The gate may be grown thermally by using RTA. This gate material could be an oxide, nitride, oxynitride, ONO structure, or any other dielectric material combination used as gate dielectric. The dielectric thickness is determined by the voltage level of the process. At this point an optional buried contact mask (BC) may be used to open selected P1 contact regions, etch the dielectric and expose P1 layer. BC could be used on P1 pedestals to form P1/P2 stacks over C1. In the P1 salicided embodiment using Ni, the dielectric deposition and buried contact etch occur before the crystallization. In the preferred embodiment, no BC is used.

Then second poly P2 layer, 300 A to 2000 A thick, preferably 500 A is deposited as amorphous or crystalline poly-silicon by LPCVD as shown in FIG. 12.3. P2 layer is defined into NMOS & PMOS gate regions intersecting the P1 layer body regions, C1 pedestals if needed, and local interconnect lines and then etched. The P2 layer etching is continued until the dielectric oxide is exposed over P1 areas uncovered by P2 (source, drain, P1 resistors). The source & drain P1 regions orthogonal to P2 gate regions are now self aligned to P2 gate edges. The S/D P2 regions may contact P1 via buried contacts. NMOS devices are blanket implanted with LDN N– dopant. Then PMOS devices are mask selected and implanted with LDP P– dopant as shown in FIG. 12.4. The implant energy ensures full dopant penetration through the residual oxide into the S/D regions adjacent to P2 layers.

A spacer oxide is deposited over the LDD implanted P2 using LTO or PECVD techniques. The oxide is etched to form spacers. The spacer etch leaves a residual oxide over P1 in a first embodiment, and completely removes oxide over exposed P1 in a second embodiment. The latter allows for P1 salicidation at a subsequent step. Then NMOS devices & N+ poly interconnects are blanket implanted with N+. The implant energy ensures full or partial dopant penetration into the 100 A residual oxide in the S/D regions adjacent to P2 layers. This doping gets to gate, drain & source of all NMOS devices and N+ interconnects. The P+ mask is used to select PMOS devices and P+ interconnect, and implanted with P+ dopant as shown in FIG. 12.5. PMOS gate, drain & source regions receive the P+ dopant. This N+/P+ implants can be done with N+ mask followed by P+ mask. The $V_T$ implanted P1 regions are now completely covered by P2 layer and spacer regions, and form channel regions of NMOS & PMOS transistors.

After the P+/N+ implants, Nickel is deposited over P2 and salicided to form a low resistive refractory metal on exposed poly by RTA. Un-reacted Ni is etched as shown in FIG. 12.6. This 100 A–500 A thick Co-salicide connects the opposite doped poly-2 regions together providing low resistive poly wires for data. In one embodiment, the residual gate dielectric left after the spacer prevents P1 layer salicidation. In a second embodiment, as the residual oxide is removed over exposed P1 after spacer etch, P1 is salicided The thickness of Ni deposition may be used to control full or partial salicidation of P1 regions. Fully salicided S/D regions up to spacer edge facilitate high drive current due to lower source and drain resistances.

An LTO film is deposited over P2 layer, and polished flat with CMP. A second contact mask C2 is used to open contacts into the TFT P2 and P1 regions in addition to all other contacts to substrate transistors. In the shown embodiment, C1 contacts connecting latch outputs to substrate transistor gates require no C2 contacts. Contact plugs are filled with tungsten, CMP polished, and connected by metal as done in standard contact metallization of IC's as shown in FIG. 12.7.

A TFT process sequence similar to that shown in FIG. 12 can be used to build complementary Gated-FET thin film devices. Compared with CMOS devices, these are bulk conducting devices and work on the principles of JFETs. A full disclosure of these devices are provided in application Ser. No. 10/413,808 entitled "Insulated-Gate Field-Effect Thin Film Transistors", filed on Apr. 14, 2003 and list as inventor Mr. R. U. Madurawe, the contents of which are incorporated herein by reference. The process steps facilitate the device doping differences between MOSFET and Gated-FET devices, and simultaneous formation of complementary Gated-FET TFT devices. A detailed description for this process was provided when describing FIG. 12 earlier and is not repeated. An exemplary CGated-FET process sequence may use one or more of the following steps:

C1 mask & etch
W-Silicide plug fill & CMP
~300 A poly P1 (crystalline poly-1) deposition
P1 mask & etch
Blanket Vtn N– implant (Gated-NFET $V_T$)
Vtp mask & P– implant (Gated-PFET $V_T$)
TFT Gox (70 A PECVD) deposition
500 A P2 (crystalline poly-2) deposition
Blanket P+ implant (Gated-NFET gate & interconnect)
N+ mask & implant (Gated-PFET gate & interconnect)
P2 mask & etch
Blanket LDN Gated-NFET N tip implant
LDP mask and Gated-PFET P tip implant
Spacer LTO deposition
Spacer LTO etch to form spacers & expose P1
Ni deposition
RTA salicidation and poly re-crystallization (exposed P1 and P2)

Fully salicidation of exposed P1 S/D regions
Dopant activation anneal
Excess Ni etch
ILD oxide deposition & CMP
C2 mask & etch
W plug formation & CMP
M1 deposition and back end metallization As the discussions demonstrate, memory controlled pass transistor logic elements provide a powerful tool to make switches. The ensuing high cost of memory can be drastically reduced by the 3-dimensional integration of configuration elements and the replaceable modularity concept for said memory. These advances allow designing a routing block to overcome the deficiencies in current FPGA designs. In one aspect, a cheaper memory element allows use of more memory for programmability. That enhances the ability to build large logic blocks (i.e. course-grain advantage) while maintaining smaller element logic fitting (i.e. fine-grain advantage). Furthermore larger grains need less connectivity: neighboring cells and far-away cells. That further simplifies the interconnect structure. A new interconnect structure utilizing the methods shown so far is discussed next.

Figure 13A:
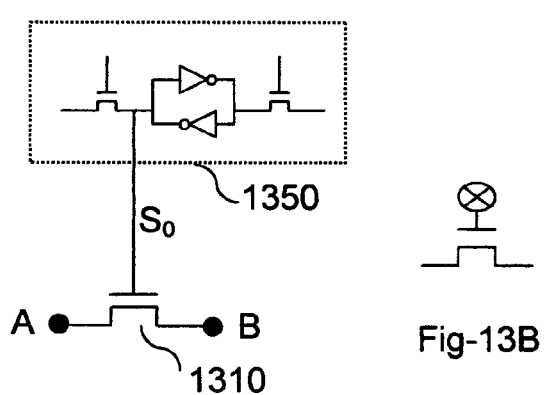
FIG. 13A shows a programmable pass-gate with TFT SRAM memory element.

A point to point switch in accordance with this teaching is shown in FIG. 13A. In that, point A is connected to point B with a substrate NMOS pass-gate 1310. Unlike U.S. Pat. No. 6,515,511 where the pass-gate is a thin-film transistor, this device is a high performance single crystal Si device to provide high conducting current when the device is on. The low performance TFT transistors are only used to build the configuration circuits shown in dotted box 1350. Configuration circuit 1350 is located vertically above the pass-gate transistor 1310. The configuration circuit 1350 includes a thin film transistor memory element. This memory element is either a volatile or a non volatile memory element. The volatile memory is comprised of DRAM, SRAM or optical memory device. The non-volatile memory is comprised of EPROM, EEPROM, ferro-electric, magnetic, fuse-link or anti-fuse element. FIG. 13A illustrates an SRAM embodiment for configuration circuit. The configuration circuit 1350 outputs a control signal $S_0$ to control pass-gate 1310. This $S_0$ voltage level may be at Vcc or ground based on memory bit polarity. The $S_0$ voltage may also be at an elevated Vcc when the SRAM is run at that higher Vcc level. The configuration circuit 1350 includes circuitry to write data into the memory element. Thus output $S_0$ can be programmed to logic 1 or logic 0 by changing memory bit polarity. The configuration circuit includes a plurality of memory bits to program a plurality of pass-gates. The memory elements in the configuration circuit are arranged in an array fashion to allow either individual access or row by row access or column by column access to memory elements. The configuration memory circuit includes generic SRAM memory based capability to store user specified data. Configuration circuit includes metal wires to provide some limited configuration signals, power and ground to memory elements. In one embodiment the SRAM memory is comprised of TFT devices to form the circuit shown in FIG. 4A, further comprising TFT transistors 401 and 402 to access the latch, and TFT CMOS inverters 403 and 404 to form a bistable latch. In preferred embodiment, signal line $S_0$ is provided to pass-gate 1310 in FIG. 13A by a contact plug formed through the insulator separating substrate transistors and TFT transistors.

Figure 13B:
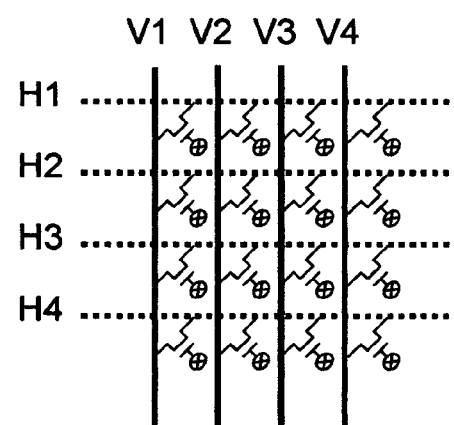
FIG. 13B shows the symbol for a TFT memory based programmable pass-gate.
Figure 13C:
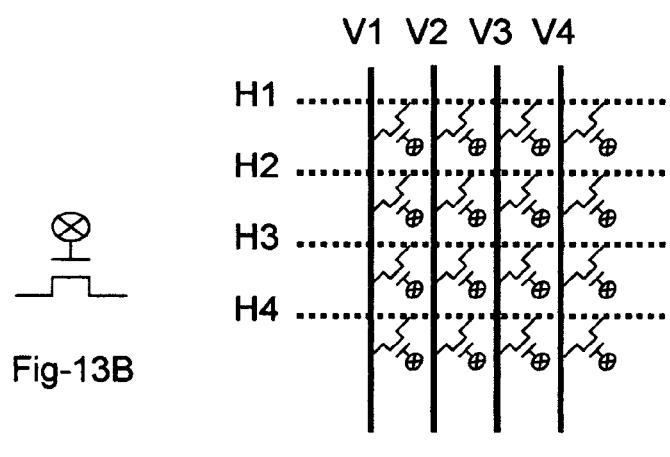
FIG. 13C shows a 4×4 array of TFT memory based programmable pass-gate matrix.

The point to point switch with TFT configuration circuits in FIG. 13A is denoted by the symbol as shown in FIG. 13B. In FIG. 13B, the circle with a cross represents the vertically integrated configuration circuit containing a TFT SRAM memory (or any other 3-dimentional memory) element. The pass-gate in FIG. 13B represents a single crystal Silicon transistor fabricated on a substrate. This pass-gate could be constructed on SOI substrate, with TFT integrated above that to form configuration memory. A 4×4 Programmable cross-point switch matrix utilizing the point to pint switch in FIG. 13A is shown in FIG. 13C. In FIG. 13C, every intersection point between the V-lines (V1 to V4) and H-lines (H1 to H4) is populated with a point to point switch. This could be fully populated as shown, or partially populated depending on the need. The configuration circuit for FIG. 13C has 16 memory elements and configuration access to change the memory data. A programmable means to configure the cross-point matrix include setting memory data to achieve a user specified connecting pattern. Compared to standard planar SRAM technology, the new cross-point switch has only the 16 wide pass-gates on the substrate, and 96 TFT transistors are moved vertically above that. SRAM contain CMOS structures and is impacted by N-well related spacing rules for latch-up prevention. For a typical 6 times the minimum width wide pass-gate area of 1×, 96 SRAM transistors take 2× more silicon foot print requiring a 3× silicon for the matrix. TFT has no such latch-up restrictions and both pass-gates and TFT SRAM take about the same layout area and 1× total Silicon. The new point to point switch allows almost a 66% reduction in silicon utilization for such wire connections.

Figure 6A:
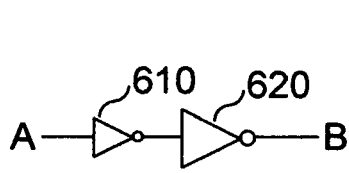
FIG. 6A shows an exemplary CMOS buffer comprising two inverters.
Figure 6B:
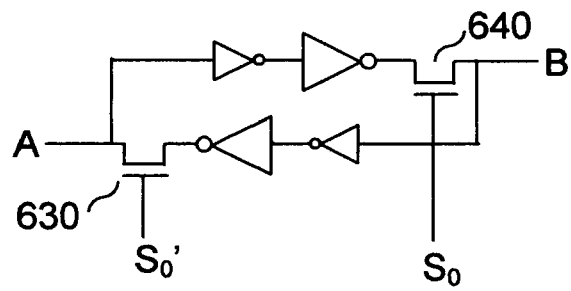
FIG. 6B shows an exemplary programmable bi-directional buffer.
Figure 6C:
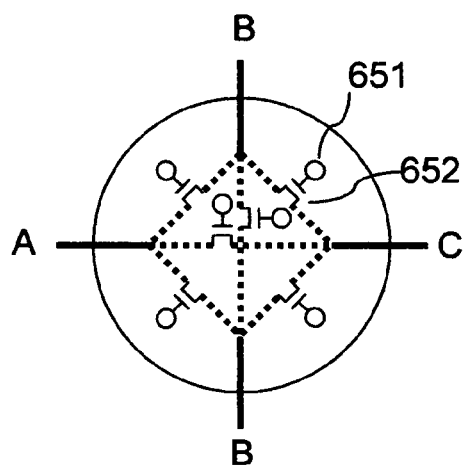
FIG. 6C shows an exemplary 6 pass-gate Bridge to connect four points.

A new programmable tri-state buffer for programmable logic applications is discussed next. This new programmable tri-state buffer is connected between two horizontal (H) and vertical (V) lines, or to provide a buffered signal from A to B as shown in FIG. 6A and FIG. 6B. A process technology independent programmable buffer circuit is shown in FIG. 14A, while the corresponding circuit symbol is shown in FIG. 14B. In FIG. 14A, element 1401 represents the 6T SRAM cell shown in FIG. 4B element 450, or in FIG. 13 element 1350. It could be any one of configuration circuits as illustrated in FIG. 7 and FIG. 8 that have complementary signal outputs $S_0$ and $S_0'$. A TFT configuration circuit is preferred for this design to reduce cost. The circuit in FIG. 14A can be easily constructed using standard CMOS logic to perform the same function at a higher Silicon foot print. Inside configuration circuit 1401, SRAM memory element holds data state B and provide complementary output B' as shown in FIG. 14A. This memory element can hold two stable logic outputs: B=0 and B=1.

(i) B=1 state: NMOS gates 1403 & 1404 are both on. NMOS 1407 and PMOS 1408 are both off, passing V wire input to the inputs of inverters 1405 and 1406. Those two inverters drive PMOS 1409 and NMOS 1410 providing a 2-stage buffered output at H having the same polarity as the V wire input. Inverter 1405, PMOS 1409 pair and inverter 1406, NMOS 1410 pair are scaled to optimize the buffered output driver. The output driver strength is scaled to the H segmented wire length (hence capacitance) it needs to drive. These are arranged in different lengths for the chip: ¼ chip length wires, ½ chip length wires, ¾ chip length wires and full chip length wires in one embodiment. These could be divided into different length sequences. The buffer sizing is chosen to have different driver strengths to result in the same predictable wire delay for the driven H segment. A similar buffer can be used to drive I/O's of the chip. As the buffer is a part of the fitting algorithm through its programmability, a fixed buffer delay allows automated timing analysis to be predictable and calculable.

(ii) B=0 state: NMOS gates 1403 & 1404 are both off. In addition, NMOS gate 1407 and PMOS gate 1408 are both on. Zero input to inverter 1405 drives a high to turn off PMOS 1409. Similarly one input to inverter 1406 drives a low output to turn NMOS 1410 off. That makes the output driver tri-stated. V and HI lines are not connected. Furthermore both V and H lines are also isolated from the buffer circuit itself The programmable tri-state buffer in its first configuration connects V to H through the output buffer. In its second configuration, V and H lines are not connected, and the output buffer is tri-stated. A simplified symbol for the circuit in FIG. 14A having one input and one output is shown in FIG. 14B. The circle with a cross in FIG. 14B indicates the memory element controlling both pass-gate and the buffer.

Advantages with the programmable buffer are as follows. It is programmable by the user. Output drive from the buffer (PMOS 1409 and NMOS 1410) is not gated by a resistive ON transistor. Programmable pass-gates 1403 and 1404 do not have to be large width as the input trip points for inverters 1405 and 1406 can be independently tuned for fast transmission. The driven H wire delay is predictable. The driven H wire delay is adjusted to wire length. The fitting program has a tracking technique (switch element) with fixed delays to calculate timing. SRAM in configuration circuit can be at elevated Vcc to prevent Vt loss. Preferred embodiment has TFT SRAM above logic transistors vertically integrated to reduce cost. Transistor count, without memory, is 10 compared to 4 for the ASIC buffer in FIG. 6A. Large area wide driver buffer is same as in ASIC, hence layout area is less than 2× of that in ASIC.

A second embodiment of the programmable buffer is shown in FIG. 14C, and is represented by the same symbol as in FIG. 14B. In FIG. 14C, a first programmable 2:1 MUX comprised of pass-gates 1453 and 1457 couples either input V or a ground supply denoted logic-0 to inverter 1455. Inverter 1455 drives the PMOS pull-up 1459 transistor. A second programmable 2:1 MUX comprised of pass-gates 1454 and 1458 couples either input V or a power supply denoted logic-1 to inverter 1456. Inverter 1456 drives NMOS pull-down 1460 transistor. Configuration circuit 1451 having complementary data signals B and B' control the two programmable MUX's. Signal B=1 couples input V to output H via the buffer. Signal B'=1 couples inputs 0 and 1 to inverters 1455 and 1456 respectively, which drive PMOS 1459 and NMOS 1460 off to tri-state the buffer from H. During this latter stage, input V and output H are both isolated from the buffer circuit.

Figure 15A:
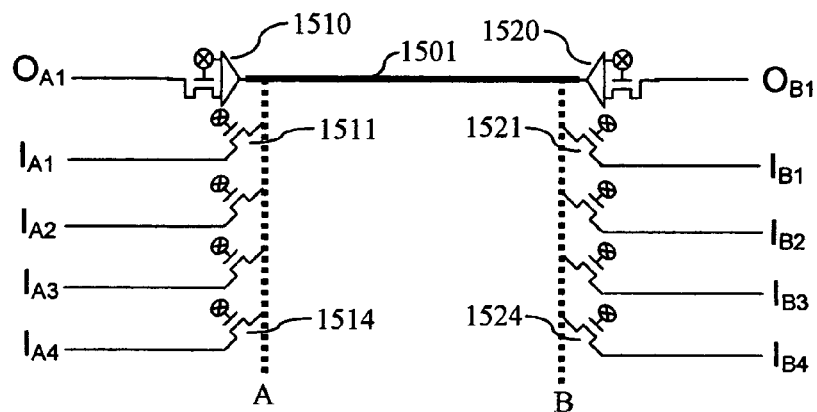
FIG. 15A shows a bi-directional transmit buffered wire with multiple inputs.

A first embodiment of the buffer shown in FIG. 14 used in a routing block is shown in FIG. 15. In FIG. 15A, node A is connecting a node B through a long wire segment 1501. Two buffered drivers 1510 and 1520 as shown in FIG. 14 are connected back-to-back in FIG. 15A to form this bi-directional data wire. Data can traverse from A to B or from B to A based on which buffered driver is enabled. Such pairing greatly facilitates routing flexibility in FPGA's as data flow is now no longer unidirectional on one wire and the direction can be programmed by the user. Node A is comprised of an output $O_{A1}$ and four inputs $I_{A1}$ through $I_{A4}$. Node B is comprised of an output $O_{B1}$ and four inputs $I_{B1}$ through $I_{B4}$. There can be fewer or more inputs at either end. Output at A and B are connected to the wire by buffered drivers 1510 and 1520 respectively. Inputs at A are connected by point to point switches 1511 to 1514, while inputs at B are connected by switches 1521 to 1524. These point to point switches were shown in FIG. 13. When A node is transmitting (i.e. 1510 is active), B node receives data (i.e. 1520 is inactive) and visa-versa. Outputs transmit data while inputs receive data.

Figure 15B:
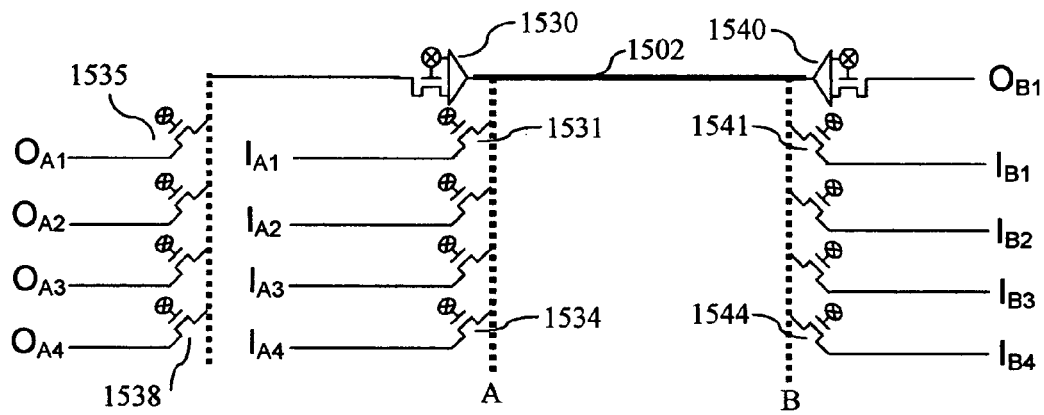
FIG. 15B shows a bi-directional transmit buffered wire with multiple inputs and outputs.

A plurality of outputs can transmit data on a single wire 1502 as shown in FIG. 15B. For clarity, only four outputs $O_{A1}$ to $O_{A4}$ are shown at A end in FIG. 15B. Fewer or more outputs at A end and a plurality of outputs at B end can be connected to the programmable buffers 1530 and 1540 respectively. Programmable point to point switches 1535 to 1538 allow one of the outputs $O_{A1}$ to $O_{A4}$ be selected to feed driver 1530. These switches were shown in FIG. 13. At the receiving end, a plurality of switches allows appropriate data selection for the wire. For example, input $I_{B1}$ can receive data sent by one of $O_{A1}$ to $O_{A2}$ by configuring the appropriate memory elements. In FIG. 15B, to connect output $O_{A4}$ to input $I_{B3}$ switches 1538, 1530 and 1543 are activated, and the rest are deactivated. An output signal at A can be received by multiple inputs at B and a plurality of inputs at A. This routing allows a logic block at A end to connect to a logic block at B end, a considerable distance away from A. These wire segments are especially useful for FPGA's where the logic block is large and the wire lengths and capacitances dominate signal transit times.

Figure 5C:
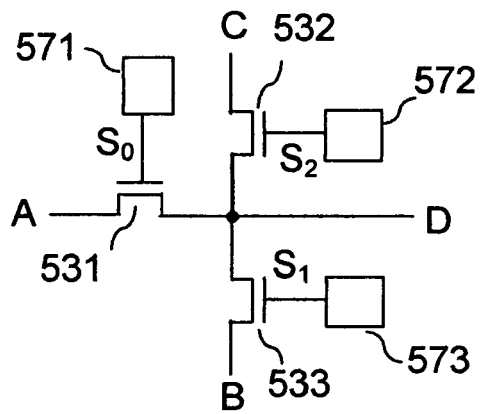
FIG. 5C shows an exemplary 3:1 MUX controlled by 3 bits.
Figure 15C:
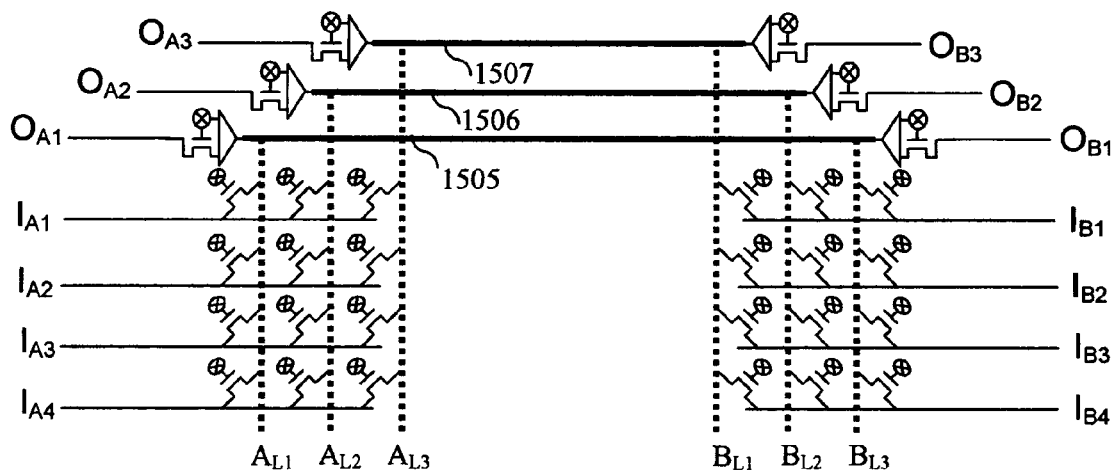
FIG. 15C shows a bi-directional transmit buffered bus with multiple inputs and outputs.

A plurality of outputs can transmit data on a plurality of wires as shown in FIG. 15C bus structure. For clarity, only three wires 1505, 1506 and 1507 are shown in FIG. 15C. At either of receiving ends, a plurality of switches allows appropriate data selection for the inputs. This cross point switch matrix for inputs is as shown in FIG. 13C. For example, input $I_{B1}$ can receive data sent by $O_{A1}$, $O_{A2}$ or $O_{A3}$ by configuring the appropriate memory element. The connection at $I_{B1}$ is a 3 bit programmable 3:1 MUX, similar to FIG. 5C. Each of the outputs $O_{A1}$, $O_{A2}$ or $O_{A3}$ in turn can be selected from multiple inputs from a programmable MUX as shown in FIG. 15B. For example, $O_{A1}$ can be selected from $O_1$, $O_2$, $O_3$ and $O_4$ arranged in a 4:1 MUX using switch elements shown in FIG. 14B. These outputs then connect through $O_{A1}$ buffer on the selected wire. Multiple outputs can be connected to multiple buffer inputs in the manner shown in cross point matrix in FIG. 13C. For example, each output $O_{A1}$, $O_{A2}$, $O_{A3}$ and $O_{A4}$ could comprise of an output from a programmable 4:1 MUX's comprising outputs $O_1$, $O_2$, $O_3$ and $O_4$ as MUX inputs. The matrix allows any one output to connect to any one of 4 wires through the wire dedicated buffer. This routing allows a logic block at A end to connect to a logic block at B end, a considerable distance away from A. These wire segments are especially useful for FPGA's where the logic block is large and wire delays dominate signal propagation times.

Another embodiment of the tri-state buffer in FIG. 14 is shown in FIG. 16A with the symbol shown in FIG. 16B. The symbol in FIG. 16B shows either pass-gate coupling or the buffer coupling of input to output. The buffer in FIG. 16A is programmed either to receive data, or transmit data. During receive mode, the buffer is tri-stated. In FIG. 16A, a pass-gate switch as shown in FIG. 13A is integrated into the buffer. One programmable memory element controls both the pass-gate and the tri-state buffer. Circuit 1601 is the configuration circuit including one 6T SRAM memory element as shown in FIG. 4. The memory element in FIG. 16A has two stable storage points: B'=0, B=1 and B'=1, B=0. The B' and B outputs control 3 NMOS pass gates 1602, 1603 and 1604.

(i) B'=1, B=0 state: NMOS gate 1602 is on and NMOS gates 1603 & 1604 are off. In addition, NMOS gate 1607 and PMOS gate 1608 are both on, driving inverters 1605 and 1606 to turn off output driver transistors NMOS 1609 and PMOS 1610. That makes the output drivers tri-stated. V and H lines are connected via pass-gate 1602. In this state, V wire receives data from H wire.

(ii) B'=0, B=1 state: NMOS gate 1602 is off, while NMOS gates 1603 & 1604 are both on. NMOS 1607 and PMOS 1608 are also both off, passing V wire input to the inputs of inverters 1605 and 1606. Those two inverters drive PMOS 1609 and NMOS 1610 providing a 2-stage buffered output having the same polarity as the V wire input. In this state the wire V is transmitting data to H, and the signal is buffered. Buffer strength is adjusted by sizing PMOS 1609 and NMOS 1610 accordingly.

In FIG. 16, the V to H line is always connected by either pass-gate 1602, or by pass-gates 1603 & 1604 through the buffer. This allows an on connection between the V and H lines when the output buffer is tri-stated with only one memory element. A second embodiment for the same design is shown in FIG. 16C, and is also represented by the same symbol as in FIG. 16B. In FIG. 16B, two 2:1 MUX's are used to select and de-select input V to the buffer. This MUX is similar to FIG. 5A comprising pass-gates pair 1653, 1657 and pass-gate pair 1654, 1658 controlled by B and B' as shown. When B=1, the buffer is selected, and B'=1, pass-gate 1652 is selected. Terminals V and H are always connected, either as a receiving or as a transmitting connection. An independent bit control of pass-gate 1652 would allow no connections between the two ports.

Figure 17A:
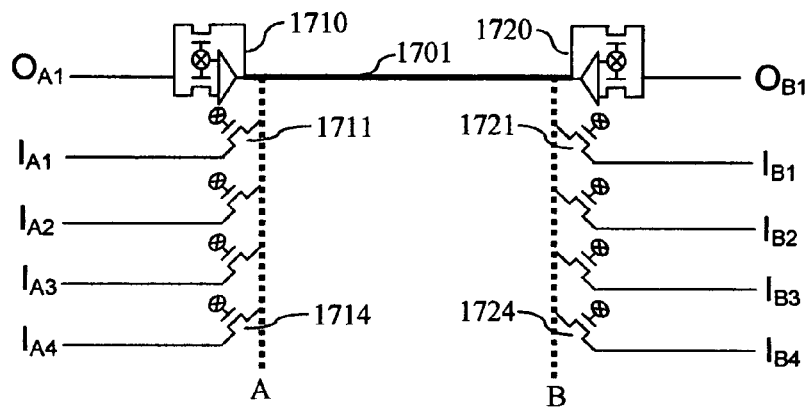
FIG. 17A shows a bi-directional transmit/receive buffered wire with multiple inputs.

It is useful to transmit and receive data on a bi-directional wire. It allows output wires to act as dual input/output (I/O) functions. The bi-directional buffer shown in FIG. 16 is utilized in FIG. 17 to construct a variety of interconnect structures. In FIG. 17A, node A is connecting a node B through a long wire segment 1701. Two buffered drivers 1710 and 1720 as shown in FIG. 16 are connected back-to-back in FIG. 17A to form this bi-directional data wire. Data can traverse from A to B or from B to A based on which buffered driver is enabled. Such pairing greatly facilitates routing flexibility in FPGA's as data flow is now no longer unidirectional on one wire and the direction can be programmed by the user. Node A is comprised of an input-output (I/O) $O_{A1}$ and four inputs $I_{A1}$ through $I_{A4}$. Node B is comprised of an I/O $O_{B1}$ and four inputs $I_{B1}$ through $I_{B4}$. I/O at A and B are connected to the wire by buffered drivers 1710 and 1720 respectively. Inputs at A are connected by point to point switches 1711 to 1714, while inputs at B are connected by point to point switches 1721 to 1724. These point to point switches were shown in FIG. 13. When A node is transmitting (i.e. 1710 buffer is active), B node receives data (i.e. 1720 buffer is inactive) and visa-versa. Outputs transmit data while inputs receive data. In this connection, either $O_{A1}$ or $O_{B1}$ is also configured to receive data. Additional inputs can also be configured to receive data.

Figure 17B:
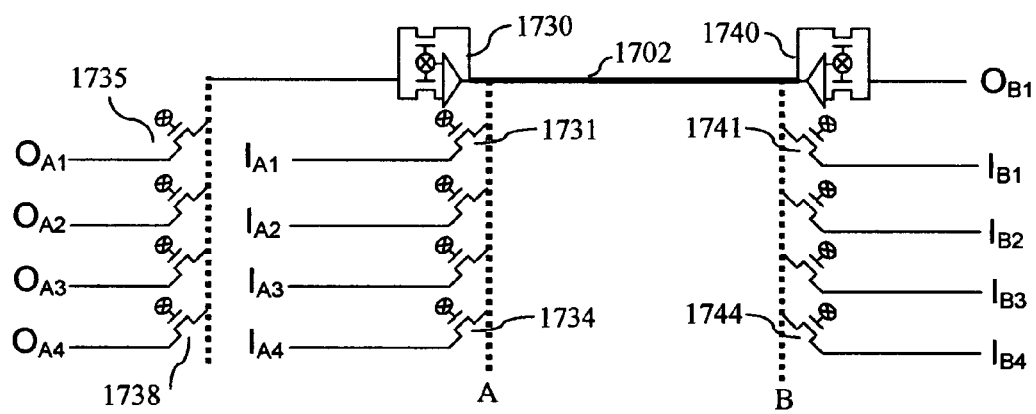
FIG. 17B shows a bi-directional transmit/receive buffered wire with multiple inputs and multiple IOs.

A plurality of I/Os can transmit data on a single wire 1702 as shown in FIG. 17B. For clarity, only four I/Os $O_{A1}$ to $O_{A4}$ are shown at A end in FIG. 17B. Fewer or more I/Os at end A and a plurality of I/Os at end B can connect to the programmable buffers 1730 and 1740 respectively. Programmable point to point switches 1735 to 1738 allow one I/O from $O_{A1}$ to $O_{A4}$ be selected to feed driver 1730. These point to point switches were shown in FIG. 13. At the receiving end, in addition to I/O $O_{B1}$, a plurality of switches allows appropriate data selection for the wire. For example, input $I_{B1}$ can receive data sent by one of $O_{A1}$ to $O_{A2}$ by configuring the appropriate memory elements. In FIG. 17B, to connect I/O $O_{A4}$ to I/O $O_{B1}$ and input $I_{B3}$ switches 1738, 1730 and 1743 are activated, and the rest are deactivated. Deactivating buffer 1740 activates pass-gate to couple $O_{B1}$. The output signal from A can be received at multiple inputs at B and a plurality of input at A. This routing allows a logic block at A end to connect to a logic block at B end, a considerable distance away from A. These wire segments are especially useful for FPGA's where the logic block is large and the wire lengths and capacitances dominate signal transit times.

Figure 17C:
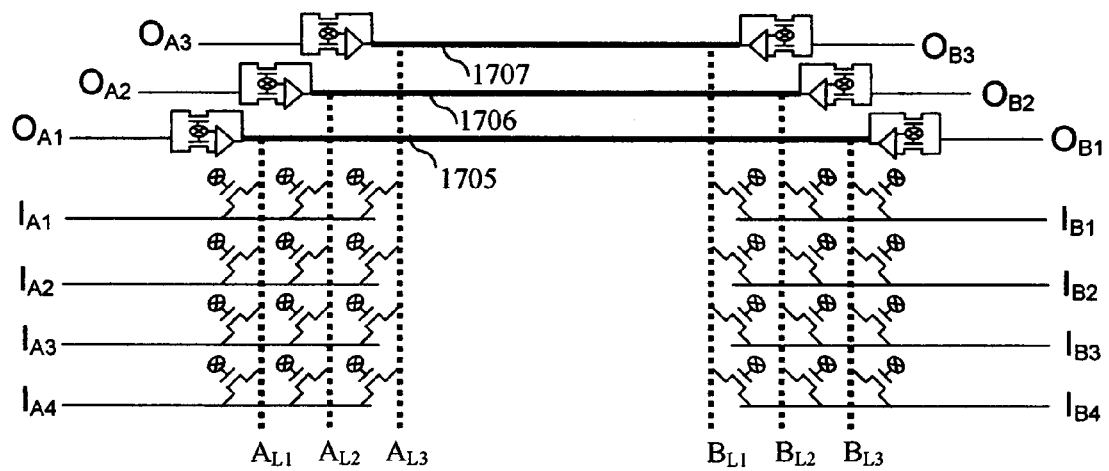
FIG. 17C shows a bi-directional transmit/receive buffered bus with multiple inputs and multiple IOs.

A plurality of outputs can transmit data on a plurality of wires as shown in FIG. 17C bus structure. For clarity, only three wires 1705, 1706 and 1707 are shown in FIG. 17C. At either of receiving ends, a plurality of switches allows appropriate data selection for the inputs. This cross point switch matrix for inputs is as shown in FIG. 13C. For example, input $I_{B1}$ can receive data sent by $O_{A1}$, $O_{A2}$ or $O_{A3}$ by configuring the appropriate memory element. The connection at $I_{B1}$ is a 3 bit programmable 3:1 MUX, similar to FIG. 5C. Each of the outputs $O_{A1}$, $O_{A2}$ or $O_{A3}$ in turn can be selected from multiple inputs from a programmable MUX as shown in FIG. 17B. For example, $O_{A1}$ can be selected from $O_1$, $O_2$, $O_3$ and $O_4$ arranged in a 4:1 MUX using switch elements shown in FIG. 14B. These outputs then connect through $O_{A1}$ buffer on the selected wire. Multiple outputs can be connected to multiple buffer inputs in the manner shown in cross point The patent or application file contains at least one drawing executed in color. Copies of this patent or patent application publication with color drawing(s) will be provided by the Office upon request and payment of the necessary fee. matrix in FIG. 13C. For example, each output $O_{A1}$, $O_{A2}$, $O_{A3}$ and $O_{A4}$ could comprise of an output from a programmable 4:1 MUX's comprising outputs $O_1$, $O_2$, $O_3$ and $O_4$ as MUX inputs. The matrix allows any one output Ox to connect to any one of 4 wires through the wire dedicated buffer. This routing allows a logic block at A end to connect to a logic block at B end, a considerable distance away from A. These wire segments are especially useful for FPGA's where the logic block is large and wire delays dominate signal propagation times.

Transmitting port has an off pass-gate, and an on buffer, while the receiving port has an on pass-gate and a tri-stated buffer. To avoid contention both A and B cannot transmit data simultaneously. Both A and B can receive data that may be transmitted at a mid point of such a long wire, transmitted by a similar buffer not shown in the diagram. These wires are useful to transmit data from one end of the chip to the other, or over long segments of wire and to construct programmable I/O circuits.

Figure 18:
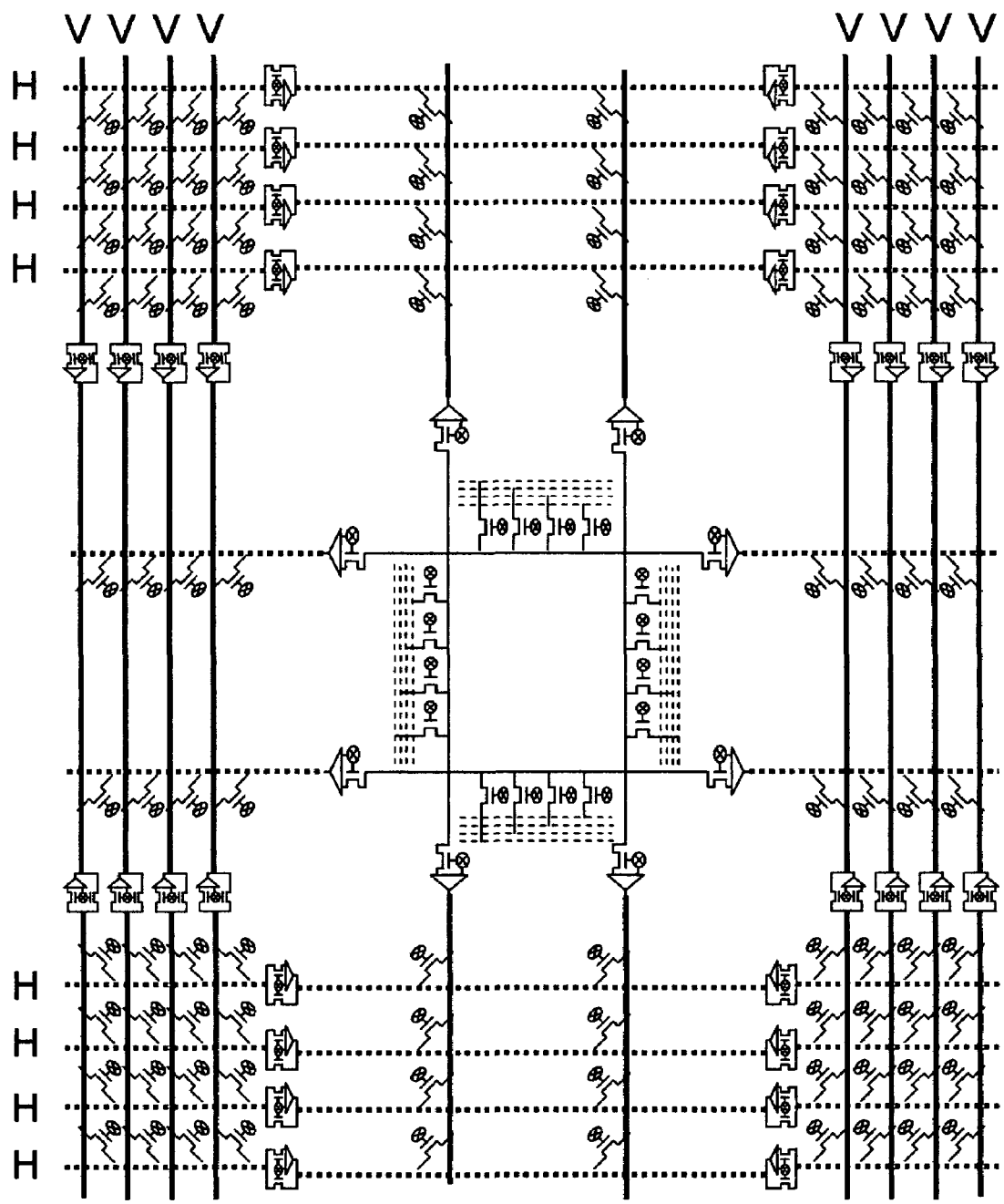
FIG. 18 shows one embodiment of a programmable logic interconnect structure utilizing various programmable interconnect structures disclosed.

FIG. 18 demonstrates one embodiment of how a programmable buffered routing block is used in an FPGA. This diagram is only to illustrate the salient features of this invention and does not represent all possible routing matrices that can be constructed with the switches as shown in FIG. 13, FIG. 14, FIG. 15, FIG. 16 and FIG. 17. In FIG. 18, a 4 wire perimeter bus with bi-directional buffered switches is used to drive signals round the perimeter of the chip. The bus can connect to pad I/O blocks. Four 4×4 cross-point switch matrices in chip corners facilitate the inter-wire connections. Data is shown to come out to the chip perimeter from the chip center along uni-directional buffered wires. They access perimeter bus at cross-point switches. Inputs and outputs from large logic blocks access local wires as shown in FIG. 15 and FIG. 17. These logic blocks also access neighboring logic blocks directly. Local wires feed to the chip center wires through a pass-gate switch point matrix. The wires can have multi length segments. Each buffer driving a wire is optimized to have a fixed delay for signal transmission. Proper selection of the switches allows complex routing connections for the FPGA construction. All complex routing paths still have predictable and calculable timing delays. In all cases under normal FPGA manufacturing techniques, the SRAM bits add a significant cost to the overall die cost. However, a 3 dimensional integration method to stack these SRAM bits above logic gates allows a significant cost savings for these high programmable content devices. In such layouts, the configuration circuit required to program the buffer is located substantially above the logic gates of the buffer, without adding to the buffer foot-print. In another embodiment, the configuration circuit may exist in a second plane compared to a first plane used for the construction of the buffer circuit.

New programmable buffers are described to route data across long wires. These buffers and pass-gates are used to build very powerful MUX structures capable of local and multi-length global routing matrices. Uni-directional and bi directional data wires with programmable buffers having tri-state capability offer predictable and fast data transfer along long wires. These buffers can be selected, or deselected by the user. Such selections allow software timing models to accurately predict randomly placed logic delays through the chip. These buffers enable multi level wire partitioning, predictability in wire delays and an overall wire delay reduction. The bi-directional data wire constructions in FPGA's enhance fitting, pin to pin routing and performance of the FPGA. A 3-dimensional SRAM process integration reduces the cost of re-programmability for these interconnect structures. A method is also shown to map a programmable buffer to an application specific hard-wire buffer. The conversion allows a further cost reduction to the user, with no change in the original timing.

Although an illustrative embodiment of the present invention, and various modifications thereof, have been described in detail herein with reference to the accompanying drawings, it is to be understood that the invention is not limited to this precise embodiment and the described modifications, and that various changes and further modifications may be effected therein by one skilled in the art without departing from the scope or spirit of the invention as defined in the appended claims.

What is claimed is:

1. A programmable interconnect structure to couple a first node to a second node for an integrated circuit comprising:
   a power voltage and a ground voltage; and
   a pull-up circuit coupled between said power voltage and said node; and
   a pull-down circuit coupled between said ground voltage and said second node; and
   a programmable circuit coupled to said first node and to each of said pull-up and pull-down circuits; and
   a configuration circuit including at least one memory element coupled to said programmable circuit, wherein altering the data in said at least one memory element provides a programmable method of:
      decoupling said first node from second node by deactivating both said pull-up and pull-down circuits; and
      coupling said first node to second node compelled by activating said pull-up and pull-down circuits.

2. The structure of claim 1, wherein said first node is coupled to an output from a logic block, said logic block comprising one of fixed logic and programmable logic.

3. The structure of claim 1, wherein said second node is coupled to a wire comprising a capacitive load.

4. The structure of claim 1, wherein said configuration circuit is comprised of one memory element.

5. The structure of claim 1, wherein said programmable method of decoupling said first node from said second node is further comprised of isolating said second node from both pull-up and pull-down circuits.

6. The structure of claim 1, wherein said programmable method of coupling said first node to said second node is further comprised of transferring a signal at said first node to said second node by the method comprised of:
   deactivating said pull-down circuit and activating said pull-up circuit to provide a source current from said power voltage to said second node; and
   deactivating said pull-up circuit and activating said pull-down circuit to provide a sink current from said second node to said ground voltage.

7. The structure of claim 6, wherein said source current and sink current strength is adjusted by sizing said pull-up and pull-down circuit transistors respectively, and wherein adjusting said source and sink current strengths provides a restored signal at said second node.

8. The structure of claim 1, wherein the programmable circuit is further comprised of:
   an inverter comprising an input and an output; and
   a programmable method of selecting one of said first node and said ground voltage as the input of said inverter; and
   the output of said inverter coupled to said pull-up circuit.

9. The structure of claim 1, wherein the programmable circuit is further comprised of:
   an inverter comprising an input and an output; and
   a programmable method of selecting one of said first node and said power voltage as the input of said inverter; and
   the output of said inverter coupled to said pull-down circuit.

10. The structure of claim 1, further comprised of:
    said pull-up and pull-down circuits, each comprising a pass-gate fabricated on a substrate layer; and
    said configuration circuit comprising said at least one memory element fabricated substantially above said substrate layer.

11. The stricture of claim 10, wherein said configuration circuit is comprised one of a thin film diode, thin film resistor, thin film capacitor and a thin film transistor.

12. The structure of claim 1, wherein said memory element is comprised one of volatile and non volatile memory element.

13. The structure of claim 1, wherein said memory element is selected from one of a fuse link, an anti-fuse capacitor, an SRAM cell, a DRAM cell, a metal optional link, an EPROM cell, an EEPROM cell, a flash cell, a ferro-electric element, an optical element and a magnetic element.

14. The structure of claim 1, wherein said programmable circuit further comprises:
    one or more programmable pass-gates and logic transistors located on a substrate layer; and
    one or more configuration access transistors and memory transistors located on thin-film layers substantially above said substrate layer; and
    one or more control signals generated from said thin film memory elements coupled to gate electrodes of said pass-gates; and
    user access circuitry to change said thin film memory data via said thin film access transistors.

15. The structure of claim 14, wherein the configuration circuits are located above the substrate layer by using a thin film transistor module comprising at least one of:
    applying C1 mask and etching contacts;
    forming W-silicide plug and performing CMP;
    depositing crystalline poly-1 (P1);
    performing P1 mask & etching P1;
    applying blanket NMOS Vt P− implant;

applying PMOS Vt mask & N− implant;
depositing Gox;
depositing amorphous poly-2 (P2);
applying P2 mask & etching P2;
applying blanket LDN N− implant;
applying LDP mask & P− implant;
depositing a spacer oxide and etching the spacer oxide;
applying blanket N+ implantation of NMOS G/S/D;
applying P+ mask & implanting PMOS G/S/D;
depositing Nickel;
salicidizing the Nickel on the G/S/D regions & interconnect
performing RTA anneal—P1 and P2 re-crystallization and dopant anneal;
depositing ILD oxide & CMP;
applying C2 mask & etch;
forming a W plug utilizing CMP;
depositing M1.

16. The structure of claim 14, wherein the configuration circuits are located above the substrate layer by using a thin film transistor module comprising at least one of:
applying C1 mask and etching contacts;
forming W-silicide plug and performing CMP;
depositing crystalline poly-1 (P1);
performing P1 mask & etching P1;
applying blanket Gated-NEET Vt N− implant;
applying Gated-PEET Vt mask & P− implant
depositing Gox;
depositing anioiphous poly-2 (P2);
applying blanket P+ implantation of Gated-NFET Gate;
applying N+ mask & implanting Gated-PFET Gate;
applying P2 mask & etching P2;
applying blanket LDN N implant (Gated-NFET LDD);
applying LDP mask & P implant (Gated-PFET LDD);
depositing a spacer oxide and etching the spacer oxide;
depositing Nickel;
sailcidizing the Nickel on exposed P1 and P2;
salicidizing P1 completely;
performing RTA anneal—P1 and P2 re-crystallization end dopant anneal;
depositing ILD oxide & CMP;
applying C2 mask & etch;
forming a W plug utilizing CMP;
depositing M1.

17. A programmable interconnect structure to couple a first node to a second node for an integrated circuit comprising:
a wire having a first end and a second end; and
a first programmable interconnect structure as in claim 6, the first node of said first claim 6 structure coupled to said first node and the second node of said first claim 6 structure coupled to said first end of wire; and
a second programmable interconnect structure as in claim 6, the first node of said second claim 6 structure coupled to said second node and the second node of said second claim 6 structure, coupled to said second end of wire; and
a programmable method of coupling said first node to the wire by coupling said first claim 6 structure, and coupling said second node to the wire by coupling said second claim 6 structure; and
a programmable method of decoupling said first and second nodes from the wire by decoupling both of said first and second claim 6 structures.

18. The structure of claim 17 further comprising:
a plurality of programmable wire structures to couple two nodes, each wire structure coupled between said first end of wire and an external input, each wire structure further comprised of;
pass-gate fabricated on a substrate layer to electrically connect the two nodes; and
a configuration circuit including at least one memory element to control said pass-gate fabricated substantially above said substrate layer; and
a programmable method to select between isolating the two nodes and connecting the two nodes by changing data stored in said memory bit; and
a programmable method of selecting at least one of said external inputs to connect to said wire.

19. The structure of claim 17 further comprising:
a plurality, of programmable wire structures to couple two nodes, each wire structure coupled between said second end of wire and an external input, each wire structure further comprised of:
a pass-gate fabricated on a substrate layer to electrically connect the two nodes; and
a configuration circuit including at least one memory element to control said pass-gate fabricated substantially above said substrate layer; and
a programmable method to select between isolating the two nodes and connecting the two nodes by changing data stored in said memory bit; and
a programmable method of selecting at least one of said external inputs to connect to said wire.

20. The structure of claim 17 further comprising:
a plurality of programmable wire structures to couple two nodes, each wire structure coupled between said first node and an external output each wire structure further comprised of:
a pass-gate fabricated on a substrate layer to electrically connect the two nodes; and
a configuration circuit including at least one memory element to control said pass-gate fabricated substantially above said substrate layer; and
a programmable method to select between isolating the two nodes and connecting the two nodes by changing data stored in said memory bit; and
a programmable method of selecting at least one of said external outputs to connect to said first node.

21. The structure of claim 17 further comprising:
a plurality of programmable wire structures to couple two nodes, each wire structure coupled between said second node and an external output, each wire structure further comprised of:
a pass-gate fabricated on a substrate layer to electrically connect the two nodes; and
a configuration circuit including at least one memory element to control said pass-gate fabricated substantially above said substrate layer; and
a programmable method to select between isolating the two nodes and connecting the two nodes by changing data stored in said memory bit; and
a programmable method of selecting at least one of said external outputs to connect to said second node.

22. A programmable interconnect structure to couple a plurality of first nodes to a plurality of second nodes for an integrated circuit comprising:
a first side comprising each of said first nodes wherein said structure originates and a second side comprising each of said second nodes wherein said structure terminates; and a plurality of programmable interconnect structures as stated in claim 17, each said claim 17 structure further comprising:
the first node of claim 17 structure coupled to a first node at said first side with said structure wire having the first end at said first side; and
the second node of claim 17 structure coupled to a second node at said second side with said structure wire having the second end at said second side.

23. The structure in claim 22 further comprising:
a plurality of programmable wire structures to couple two nodes, each wire structure further comprised of:
a pass-gate fabricated on a substrate layer to electrically connect the two nodes; and
a configuration circuit including at least one memory element to control said pass-gate fabricated substantially above said substrate layer; and
a programmable method to select between isolating the two nodes and connecting the two nodes by changing data stored in said memory bit; and
a plurality of inputs, each said input connecting to one node of a said wire structure, the other node of said wire structure connecting to the wire first end of a said claim 22 structure at said first side; and
a plurality of outputs, each said output connecting to one node of a said wire structure, the other node of said wire structure connecting to a first node at said first side; and
a programmable method of selecting at least one of said inputs and at least one of said outputs to collect to said first side.

24. The structure in claim 22 further comprising:
a plurality of programmable wire structures to connect two nodes, each wire structure further comprised of:
a pass-gate fabricated on a substrate layer to electrically connect the two nodes; and
a configuration circuit including at least one memory element to control said pass-gate fabricated substantially above said substrate layer; and
a programmable method to select between isolating the two nodes and connecting the two nodes by changing data stored in said memory bit; and
a plurality of inputs, each said input connecting to one node of a said wire structure, the other node of said wire structure connecting to the wire second end of a said claim 22 structure at said second side; and
a plurality of outputs, each said output connecting to one node of a said wire structure, the other node of said wire structure connecting to a second nude at said second side; and
a programmable method of selecting at least one of said inputs and one of said outputs to connect to said second side.

25. The structure of claim 1, further comprising a pass-gate coupled between said first and second nodes, wherein:
said configuration circuit is farther coupled to said pass-gate; and
said programmable method further comprises activating said pass-gate when said programmable circuit decouples the nodes, and deactivating said pass-gate when said programmable circuit couples the nodes.

26. The structure of claim 25, wherein said first node is coupled to an input/output from a logic block, said logic block comprising one of fixed logic and programmable logic.

27. The structure of claim 25, wherein said second node is a wire comprising a capacitive load.

28. The structure of claim 25, wherein said configuration circuit is comprised of one memory element.

29. The structure of claim 25, wherein said programmable circuit couples the nodes is further comprised of transferring a signal at said first node to said second node by the method comprised of:
deactivating said pull-down circuit and activating said pull-up circuit to provide a source count to said second node; and
deactivating said pull-up circuit and activating said pull-down circuit to provide a source current to said second node; and
adjusting said source and sink current strengths to provide a buffered signal at said second node.

30. The structure of claim 25, further comprised of:
said pass-gate fabricated on a substrate layer, and
said pull-up and pull-down circuit comprising a pass-gate fabricated on said substrate layer; and
said configuration circuit comprising the memory element fabricated substantially above said substrate layer.

31. The structure of claim 25, wherein said configuration circuit is comprised one of a thin film diode, thin film resistor, thin film capacitor and a thin turn transistor.

32. A programmable interconnect structure to couple a first node to a second node for an integrated circuit comprising:
a wire having a first end and a second end; and
a first programmable interconnect structure as in claim 30, the first node of said first claim 30 structure coupled to said first node and the second node of said first claim 30 structure coupled to said first end of wire; and
a second programmable interconnect structure as in claim 30, the first node of said second claim 30 structure coupled to said second node awl the second node of said second claim 30 structure, coupled to said second end of wire; and
a programmable method of coupling said first node to second node by activating the first claim 30 structure pass-gate and deactivating the second claim 30 structure pass-gate, or by deactivating the first claim 30 structure pass-gate and activating the second claim 30 structure pass-gate.

33. The structure of claim 25, wherein the programmable method further comprising:
providing a configuration access to alter data in stored memory element; and
generating complementary control signals from said memory element; and
controlling the polarity of said control signals by said stored memory bit polarity; and
coupling said complementary control signals to said pass-gate and pull-up and pull-down circuits; and
selecting between turning said pass-gate off and activating said pull-up and pull-down circuits, and turning said pass-gate on and deactivating said pull-up and pull-down circuits.

34. The structure of claim 32, further comprising:
a plurality of programmable wire structures to couple two nodes, each coupled between said first end of wire and an external input, each wire structure further comprised of:
a pass-gate fabricated on a substrate layer to electrically connect the two nodes; and
a configuration circuit including at least one memory element to control said pass-gate fabricated substantially above said substrate layer; and a programmable method to select between isolating the two nodes and connecting the two nodes by changing data stored in said memory bit; and a programmable method of selecting said external inputs to connect or disconnect to said wire.

35. The structure of claim 32, further comprising:

a plurality of programmable wire structures to couple two nodes, each coupled between said second end of wire and an external input, each wire structure further comprised of:

a pass-gate fabricated on a substrate layer to electrically connect the two nodes; and a configuration circuit including at least one memory element to control said pass-gate fabricated substantially above said substrate layer; and a programmable method to select between isolating the two nodes and connecting the two nodes by changing data stored in said memory bit; and a programmable method of selecting said external inputs to connect or disconnect to said wire.

36. The structure of claim 32, further comprising:

a plurality of programmable wire structures to couple two nodes, each coupled between said first node and an external input/output, each wire structure further comprised of:

a pass-gate fabricated on a substrate layer to electrically connect the two nodes; and a configuration circuit including at least one memory element to control said pass-gate fabricated substantially above said substrate layer; and a programmable method to select between isolating the two nodes and connecting the two nodes by changing data stored in said memory bit; and a programmable method of selecting said external input/outputs to connect or disconnect to said first node.

37. The structure of claim 32, further comprising:

a plurality of programmable wire structures to connect two nodes, each coupled between said second node and an external input/output, each wire structure further comprised of:

a pass-gate fabricated on a substrate layer to electrically connect the two nodes; and a configuration circuit including at least one memory element to control said pass-gate fabricated substantially above said substrate layer; and a programmable method to select between isolating the two nodes and connecting the two nodes by changing data stored in said memory bit; and a programmable method of selecting said external input/outputs to connect or disconnect to said second node.

* * * * *